(12) United States Patent
Lin et al.

(10) Patent No.: US 12,040,405 B2
(45) Date of Patent: Jul. 16, 2024

(54) MULTI-GATE DEVICE AND RELATED METHODS

(71) Applicant: Taiwan Semiconductor Manufacturing Company, Ltd., Hsinchu (TW)

(72) Inventors: Shih-Hao Lin, Hsinchu (TW); Chong-De Lien, Taoyuan (TW); Chih-Chuan Yang, Hsinchu (TW); Chih-Yu Hsu, Hsinchu County (TW); Ming-Shuan Li, Hsinchu County (TW); Hsin-Wen Su, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 415 days.

(21) Appl. No.: 17/319,783

(22) Filed: May 13, 2021

(65) Prior Publication Data
US 2022/0367725 A1    Nov. 17, 2022

(51) Int. Cl.
*H01L 29/786*    (2006.01)
*H01L 21/02*     (2006.01)
(Continued)

(52) U.S. Cl.
CPC .... *H01L 29/78618* (2013.01); *H01L 21/0259* (2013.01); *H01L 21/823807* (2013.01);
(Continued)

(58) Field of Classification Search
CPC ........... H01L 29/66742; H01L 29/0847; H01L 29/66545; H01L 29/775; H01L 21/823814; H01L 29/66553; H01L 29/78621; H01L 29/0673; H01L 27/092; H01L 29/78618; H01L 29/78696; H01L 29/42392;
(Continued)

(56) References Cited

U.S. PATENT DOCUMENTS 9,443,847 B2   9/2016   Tsai et al.
9,991,165 B1   6/2018   Huang
(Continued)

OTHER PUBLICATIONS

Tada, Munehiro et al., Low Temperature Germanium Growth on Silicon Oxide Using Boron Seed Layer and In Situ Dopant Activation, Journal of The Electrochemical Society, 157 (3), H371-H376 (2010).

*Primary Examiner* — Mouloucoulaye Inoussa
(74) *Attorney, Agent, or Firm* — Haynes and Boone, LLP

(57) ABSTRACT

A method of fabricating a device includes providing a fin extending from a substrate in a device type region, where the fin includes a plurality of semiconductor channel layers. In some embodiments, the method further includes forming a gate structure over the fin. Thereafter, in some examples, the method includes removing a portion of the plurality of semiconductor channel layers within a source/drain region adjacent to the gate structure to form a trench in the source/drain region. In some cases, the method further includes after forming the trench, depositing an adhesion layer within the source/drain region along a sidewall surface of the trench. In various embodiments, and after depositing the adhesion layer, the method further includes epitaxially growing a continuous first source/drain layer over the adhesion layer along the sidewall surface of the trench.

20 Claims, 15 Drawing Sheets

(51) Int. Cl.
  *H01L 21/8238* (2006.01)
  *H01L 27/092* (2006.01)
  *H01L 29/06* (2006.01)
  *H01L 29/161* (2006.01)
  *H01L 29/24* (2006.01)
  *H01L 29/423* (2006.01)
  *H01L 29/66* (2006.01)
  *H10B 10/00* (2023.01)

(52) U.S. Cl.
  CPC ........... *H01L 21/823814* (2013.01); *H01L 21/823864* (2013.01); *H01L 27/092* (2013.01); *H01L 29/0665* (2013.01); *H01L 29/161* (2013.01); *H01L 29/24* (2013.01); *H01L 29/42392* (2013.01); *H01L 29/66545* (2013.01); *H01L 29/66553* (2013.01); *H01L 29/66636* (2013.01); *H01L 29/66742* (2013.01); *H01L 29/78696* (2013.01); *H10B 10/125* (2023.02)

(58) Field of Classification Search
  CPC ........... H01L 29/167; H01L 29/66439; H01L 29/456; H01L 29/665; H01L 29/0665; H01L 29/7848; H01L 29/165; H01L 21/02603; H01L 21/02236; H01L 29/6653; B82Y 10/00
  See application file for complete search history.

(56) References Cited

U.S. PATENT DOCUMENTS

| | | | |
|---|---|---|---|
| 10,062,688 | B2 | 8/2018 | Yeong et al. |
| 10,312,145 | B2 | 6/2019 | Huang |
| 10,529,803 | B2 | 1/2020 | Yu et al. |
| 10,680,106 | B2 | 6/2020 | More et al. |
| 10,790,391 | B2 | 9/2020 | Singh et al. |
| 2014/0151639 | A1* | 6/2014 | Chang ................ H01L 29/0673 257/27 |
| 2019/0067490 | A1* | 2/2019 | Yang .................. H01L 29/1033 |
| 2020/0168742 | A1* | 5/2020 | Wang ................ H01L 21/02532 |
| 2020/0220018 | A1* | 7/2020 | Jang ................... H01L 29/0847 |
| 2020/0365692 | A1* | 11/2020 | Jung .................... H01L 29/785 |
| 2020/0395445 | A1* | 12/2020 | Choi ................. H01L 29/78696 |
| 2020/0395446 | A1* | 12/2020 | Yi ....................... H01L 29/0673 |
| 2021/0066477 | A1* | 3/2021 | Lee ................... H01L 29/66545 |
| 2021/0126106 | A1* | 4/2021 | Wang ................. H01L 29/6656 |
| 2021/0126135 | A1* | 4/2021 | Lee ................... H01L 29/66545 |
| 2021/0273098 | A1* | 9/2021 | Chang ............. H01L 21/823814 |

* cited by examiner

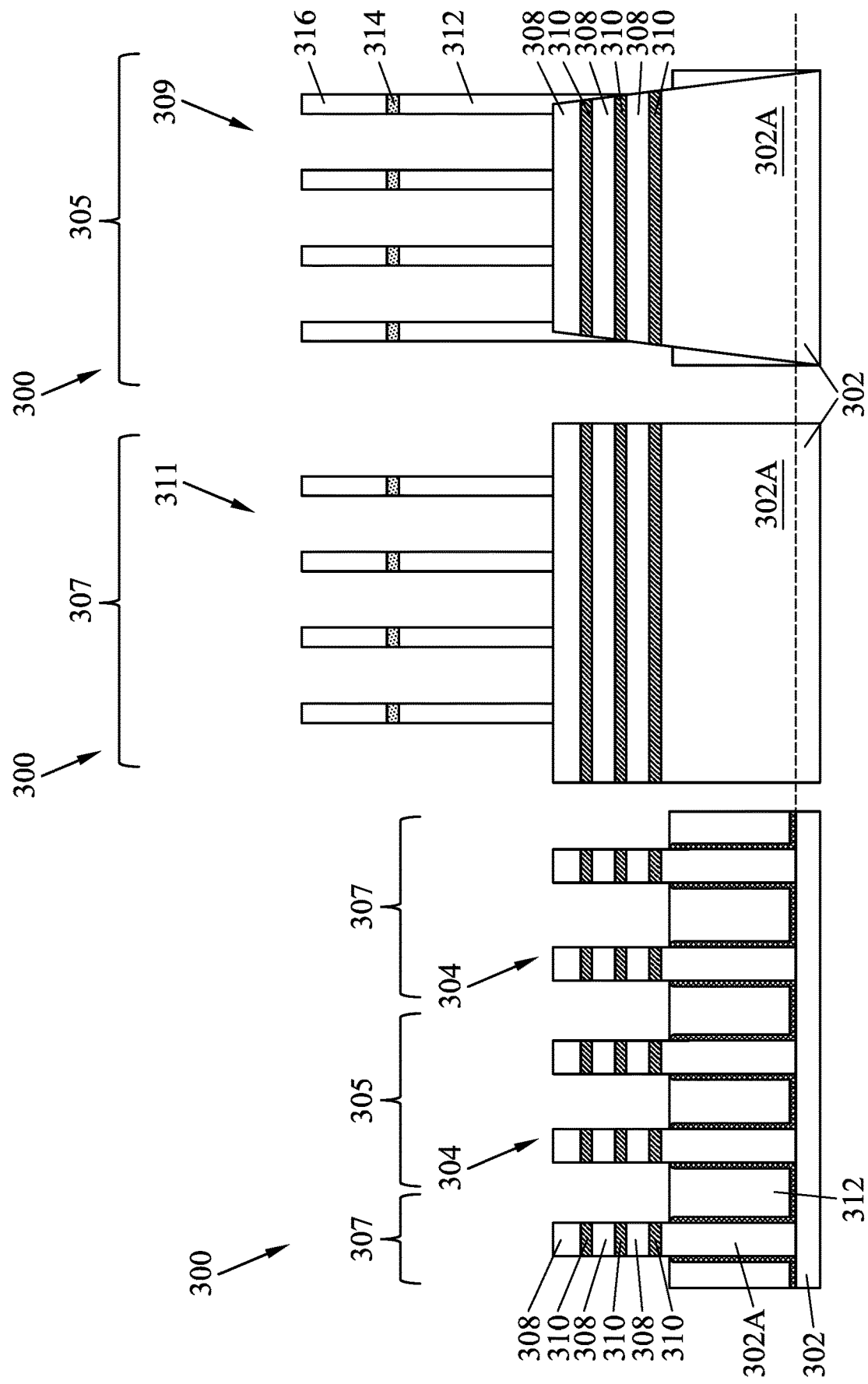

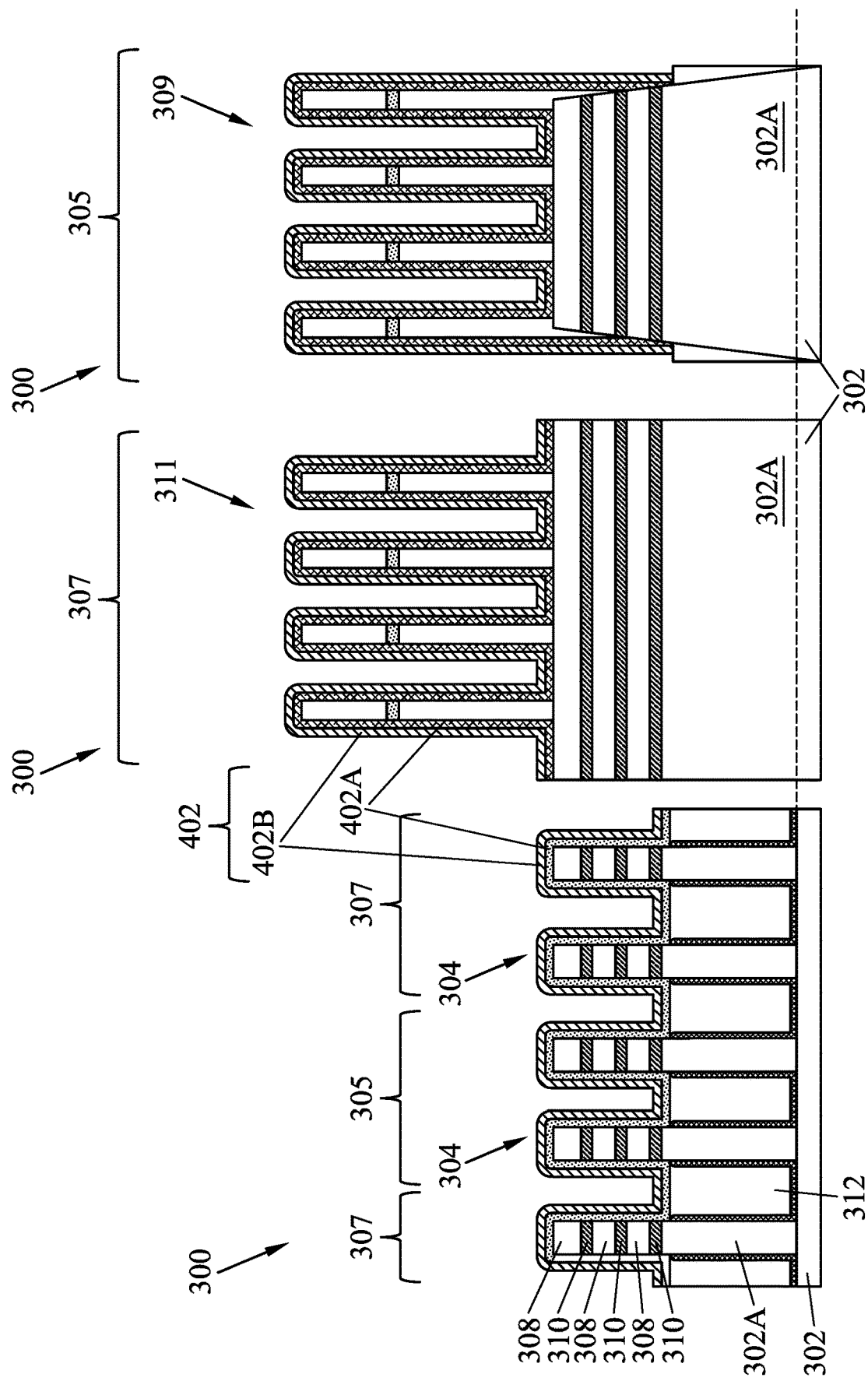

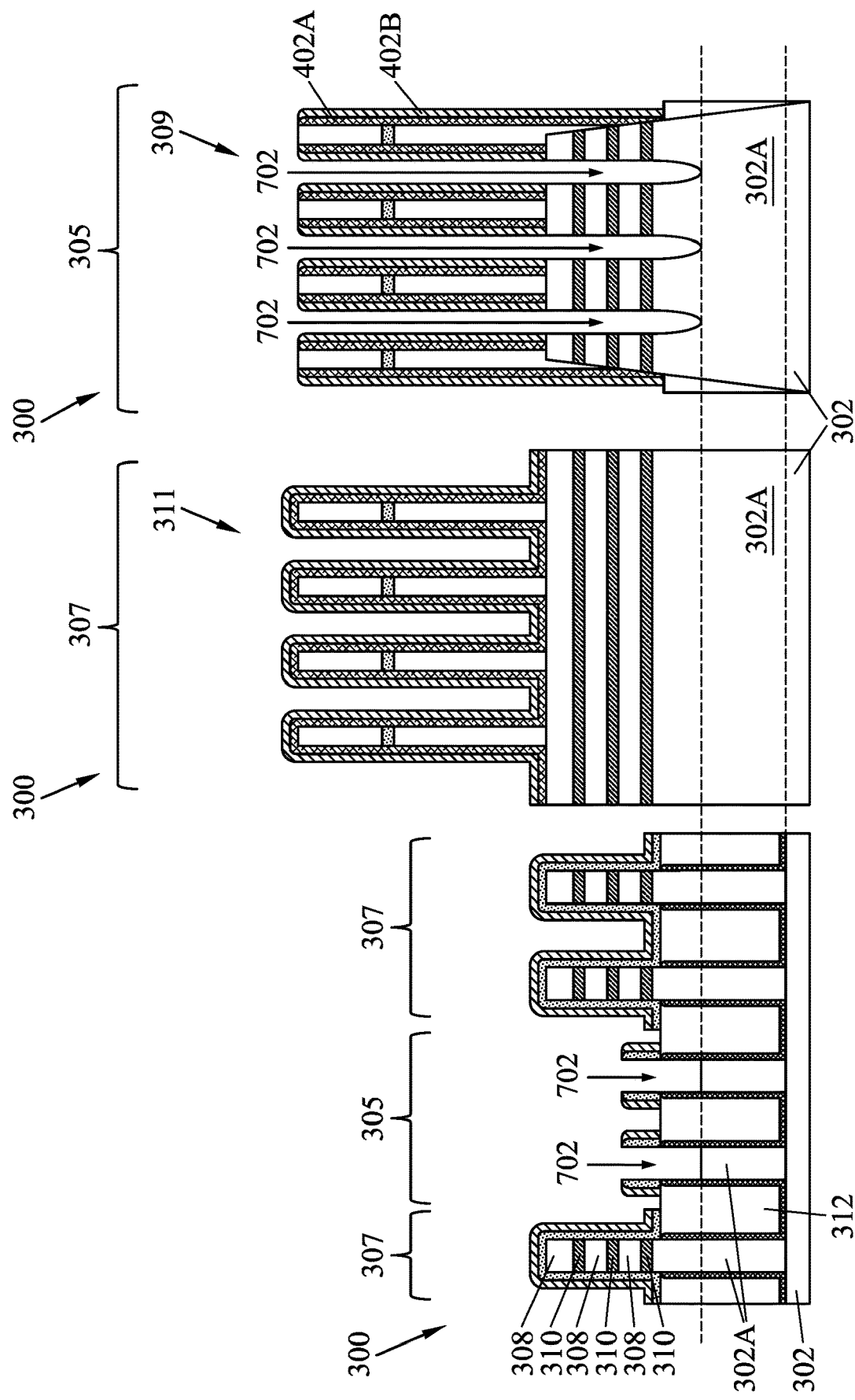

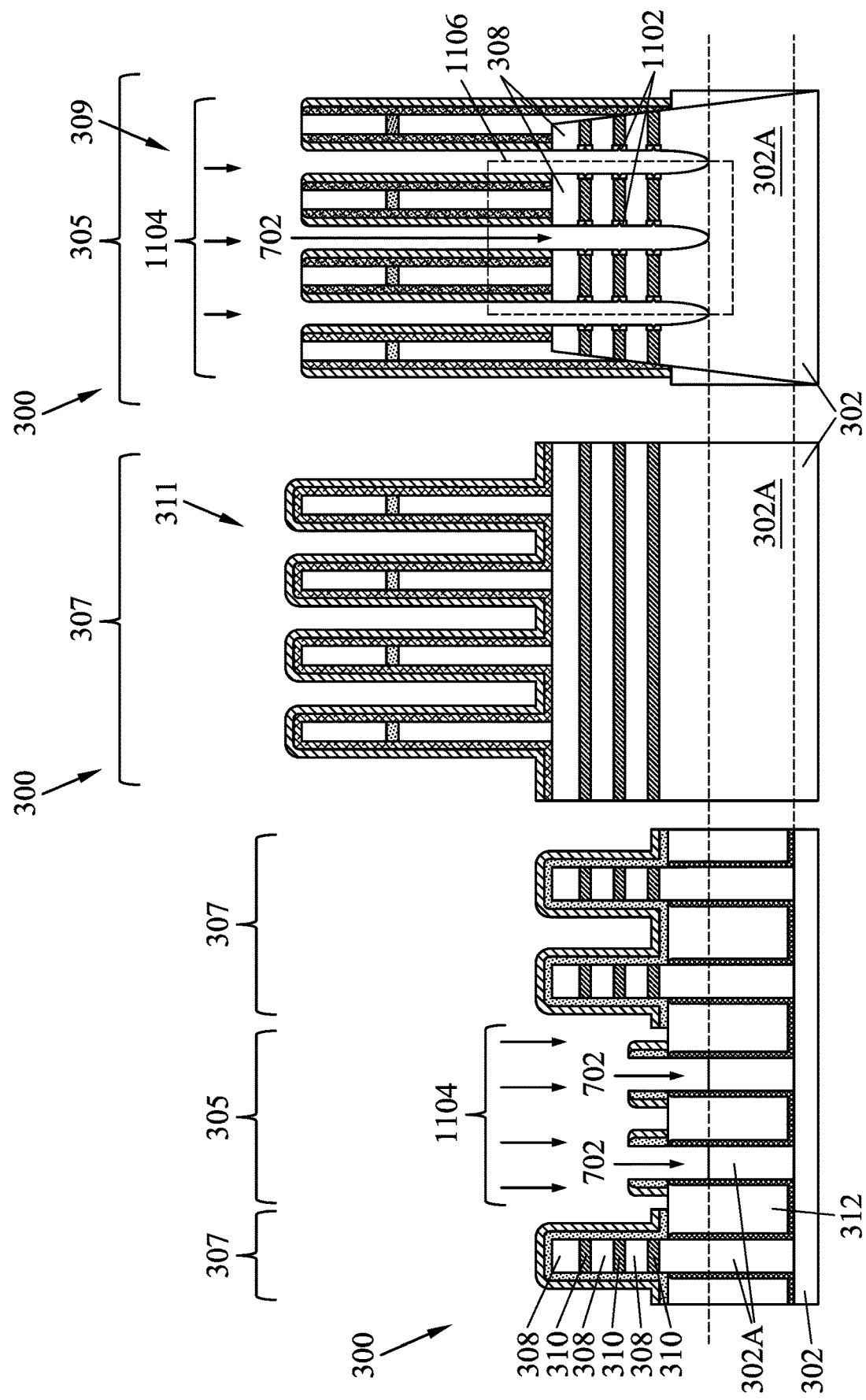

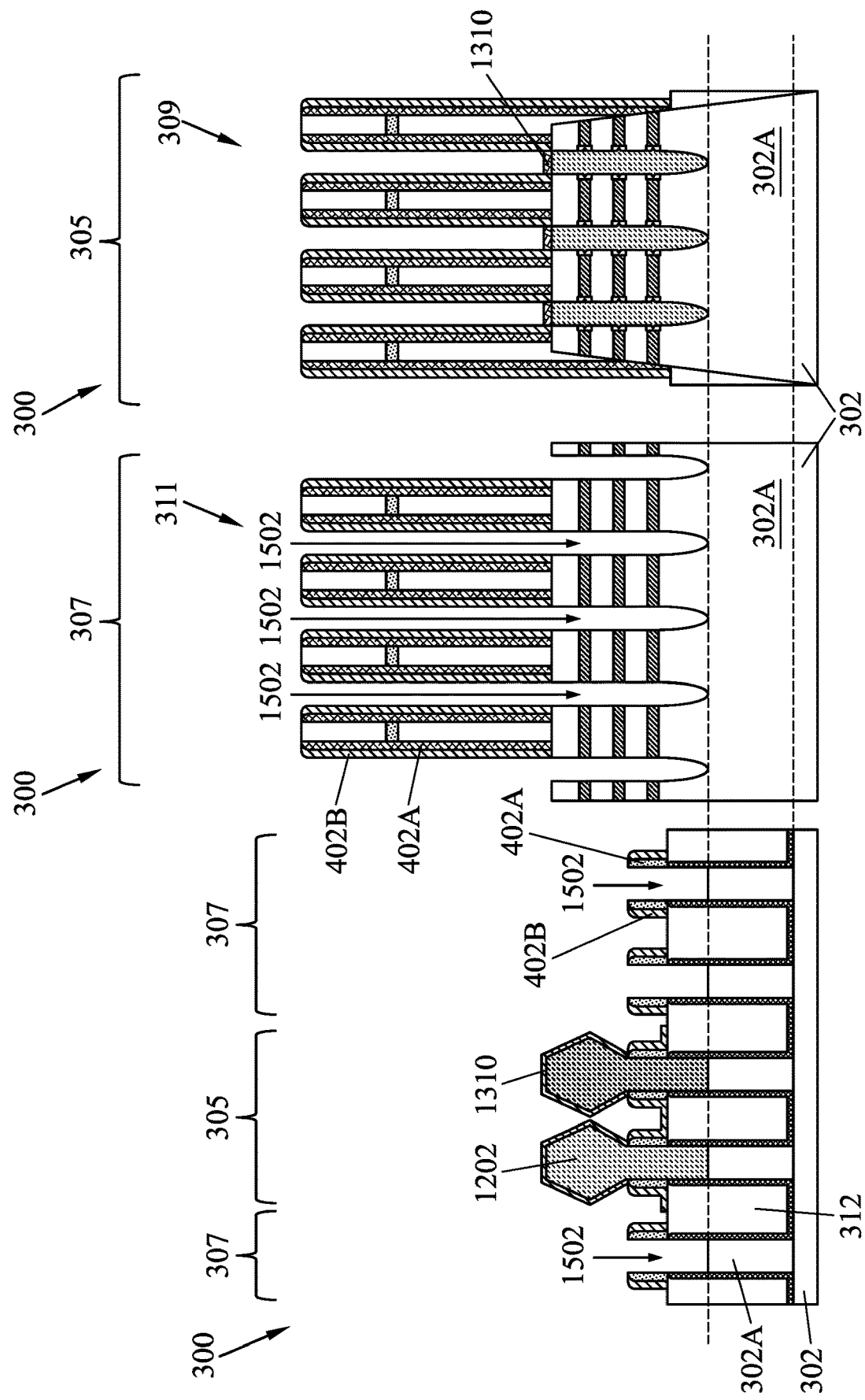

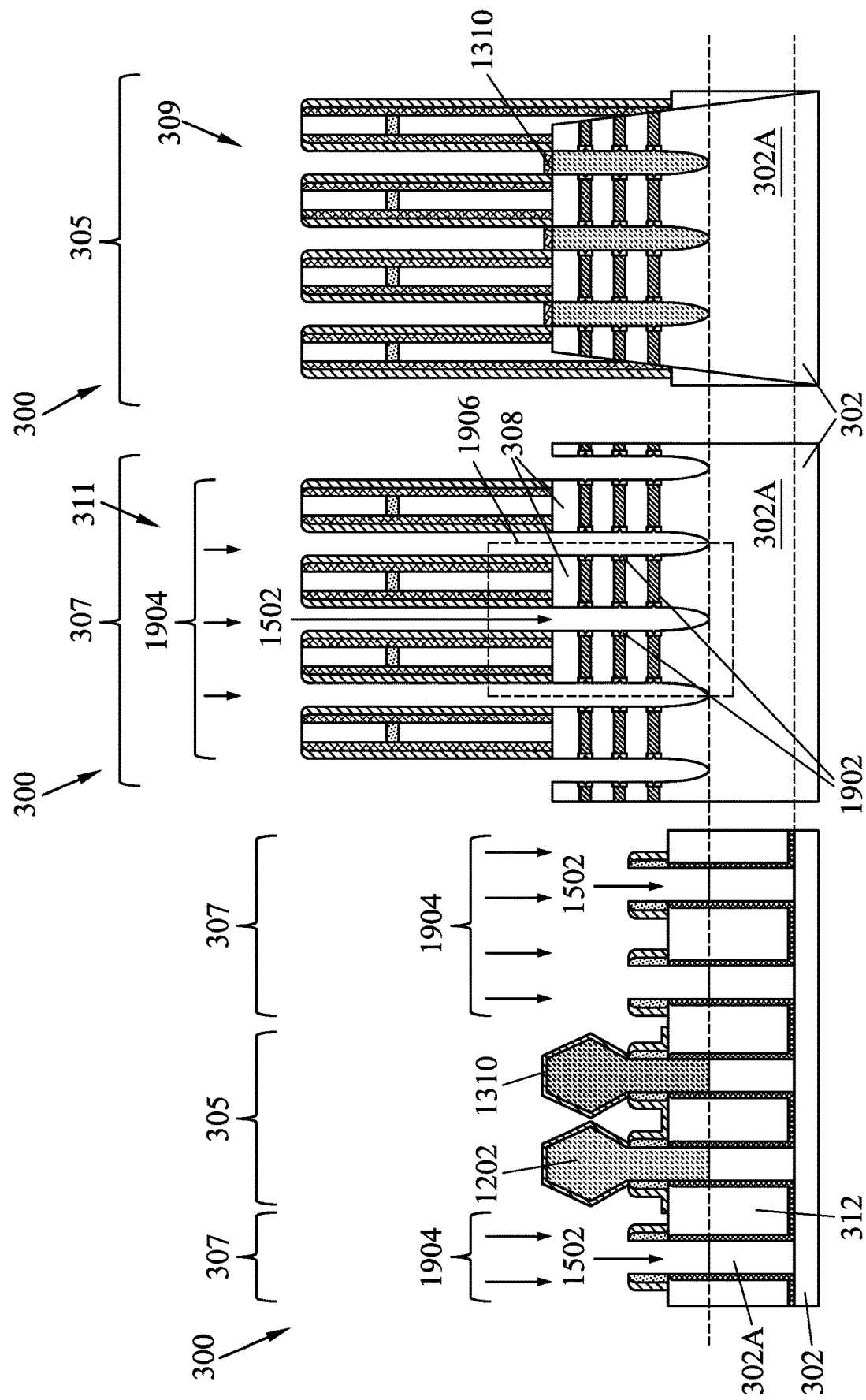

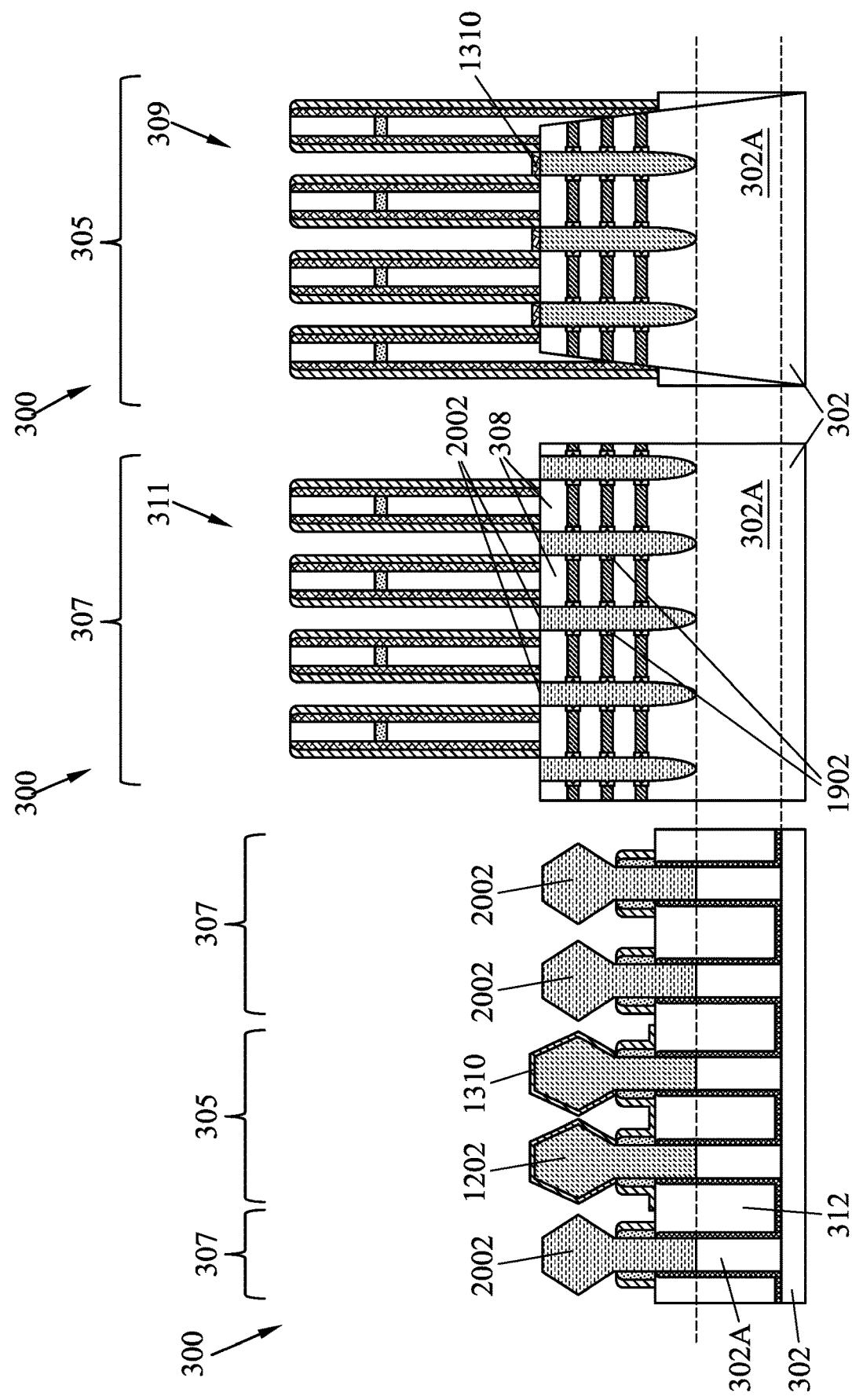

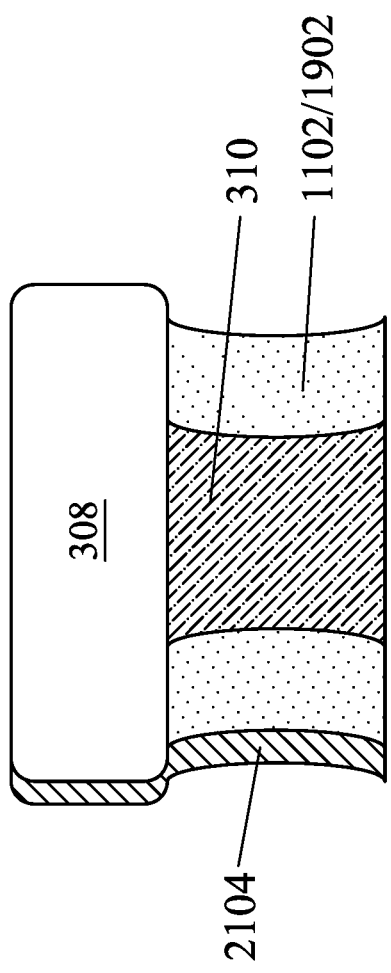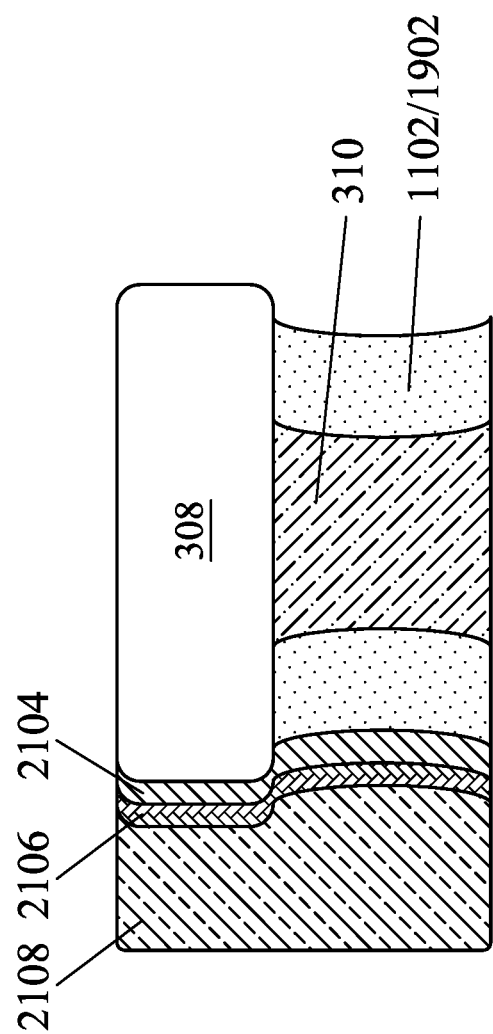

MULTI-GATE DEVICE AND RELATED METHODS

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. Another multi-gate device, introduced in part to address performance challenges associated with FinFETs, is the gate-all-around (GAA) transistor. GAA transistors get their name from the gate structure which extends completely around the channel, providing better electrostatic control than FinFETs. FinFETs and GAA transistors are compatible with conventional complementary metal-oxide-semiconductor (CMOS) processes and their three-dimensional structure allows them to be aggressively scaled while maintaining gate control and mitigating SCEs.

In general, GAA transistors may be implemented, for example, in cases where FinFETs can no longer meet performance requirements. However, despite having many desirable features, GAA transistor fabrication has continued to face challenges as a result of the ongoing scaling down of semiconductor IC dimensions.

Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 4A, 5A, 6A, 7A, 8A, 9A, 10A, and 13A provide cross-sectional views of an embodiment of the semiconductor device 300 along a plane substantially parallel to a plane defined by section BB' of FIG. 1, in accordance with some embodiments;

FIGS. 3B/3C, 4B/4C, 5B/5C, 6B/6C, 7B/7C, 8B/8C, 9B/9C, 10B/10C, and 13B/13C provide cross-sectional views of an embodiment of the semiconductor device 300 along a plane substantially parallel to a plane defined by section AA' of FIG. 1, according to some embodiments;

DETAILED DESCRIPTION

Figure 1:
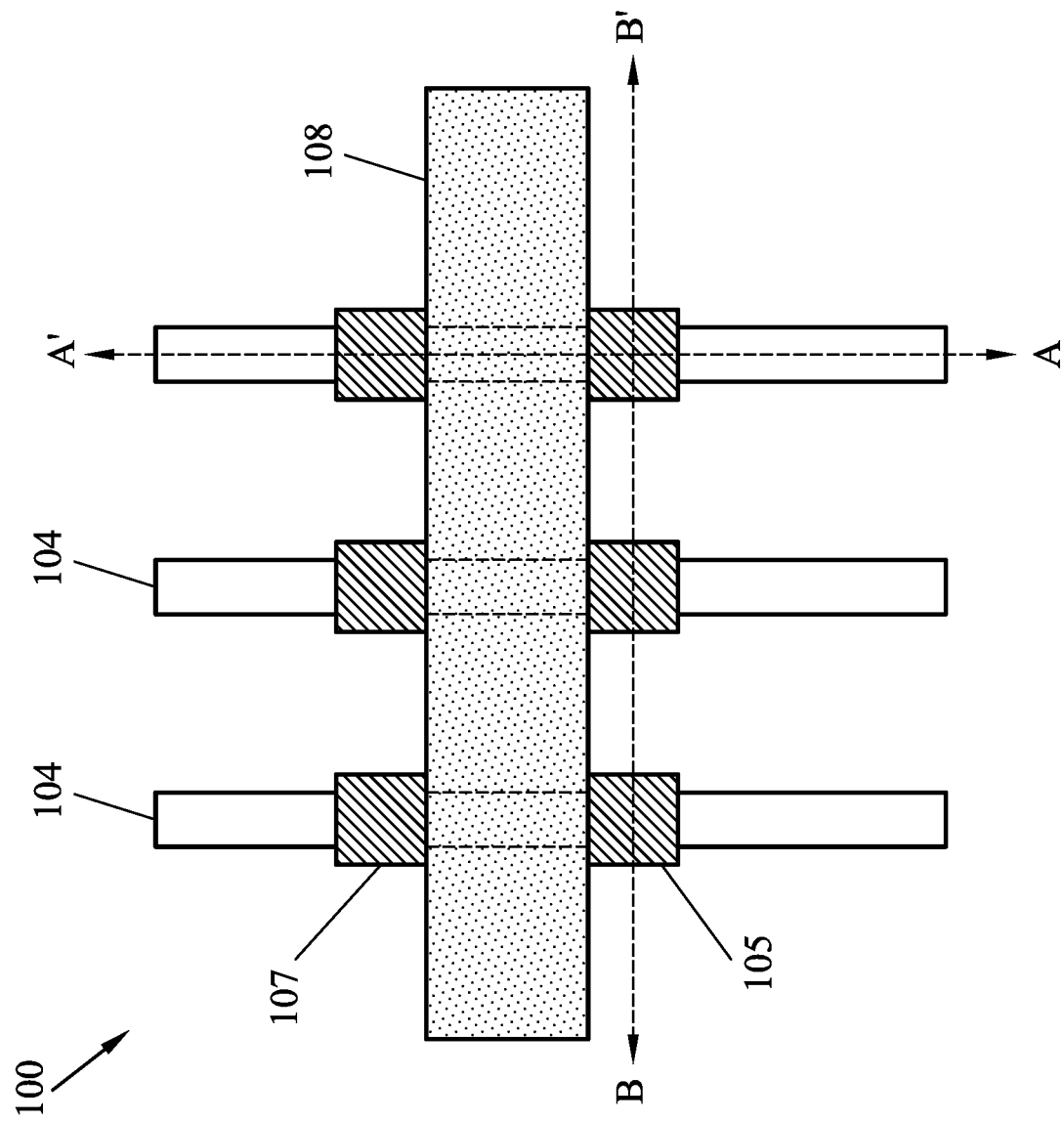
FIG. 1 provides a simplified top-down layout view of a multi-gate device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FinFETs, on account of their fin-like structure. Also presented herein are embodiments of a type of multi-gate transistor referred to as a gate-all-around (GAA) transistor. A GAA transistor includes any device that has its gate structure, or portion thereof, formed on 4-sides of a channel region (e.g., surrounding a portion of a channel region). Devices presented herein also include embodiments that have channel regions disposed in semiconductor channel layers. In various embodiments, the semiconductor channel layers may include nanosheet channel(s), nanowire channel(s), bar-shaped channel(s), and/or other suitable channel configurations. Presented herein are embodiments of devices that may have one or more channel regions (e.g., semiconductor channel layers) associated with a single, contiguous gate structure. However, one of ordinary skill would recognize that the teaching can apply to a single channel (e.g., single semiconductor channel layer) or any number of channels. One of ordinary skill may recognize other examples of semiconductor devices that may benefit from aspects of the present disclosure.

In various examples, GAA source/drain features may be formed using multiple layers which may include multiple epitaxially grown layers. In some cases, a first source/drain layer may include a lower-doped layer to prevent out-diffusion and/or suppress leakage current, and a second source/drain layer may include a higher-doped layer to reduce source/drain contact resistance. During epitaxial growth of GAA source/drain layers, the first source/drain layer may fail to form a continuous layer within a source/drain region. As one example, silane ($SiH_4$), which is often used for epitaxial layer growth of silicon-containing materials (e.g., such as SiGe, SiP, etc.), has a higher nucleation rate on silicon (Si) surfaces than on silicon nitride (SiN) surfaces. As a result, a source/drain layer (e.g., such as the first source/drain layer) in a GAA device which is grown using silane will preferentially grow on Si channel layer surfaces, as compared to neighboring SiN inner spacer layer surfaces, resulting in the source/drain layer being discontinuous. The source/drain layer discontinuity may alternatively be described as an epitaxial merge issue, as epitaxial layers grown on adjacent Si channel layers fail to merge with each other. In various cases, the source/drain layer discontinuity may degrade GAA device short-channel control and result in high sub-threshold leakage, junction leakage, and increased parasitic capacitance. Moreover, when such GAA devices are used to form static random-access memory (SRAM) devices, the source/drain layer discontinuity may result in degraded SRAM yield and Vccmin loss. For advanced, high-scaled SRAM devices, GAA device performance is critical to speed and power consumption of SRAM cell operation.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for providing multi-gate devices (e.g., such as a GAA transistors) having improved source/drain features. In some embodiments, prior to forming a source/drain epitaxial layer, an adhesion layer may be formed within a source/drain region. In particular, the adhesion layer may bond to both Si channel layer surfaces and to neighboring SiN inner spacer layer surfaces to provide a uniform base layer prior to subsequent source/drain epitaxial layer growth (e.g., of the first source/drain layer). The subsequently formed source/drain epitaxial layer, which in some examples is grown using silane, will grow over the adhesion layer along both Si channel layer surfaces and SiN inner spacer layer surfaces, resulting in a continuous source/drain epitaxial layer and effectively overcoming the epitaxial merge issue discussed above. In some embodiments, the adhesion layer includes a di-borane or di-phosphorous based material. In an embodiment, for P-type epitaxial source/drain layers, the adhesion layer may include $B_2H_x$ or $SiB_2H_x$. In another embodiment, for N-type epitaxial source/drain layers, the adhesion layer may include $P_2H_x$ or $SiP_2H_x$. In accordance with the embodiments disclosed herein, the disclosed adhesion layer provides for GAA transistors having improved source/drain features, where such GAA transistors may be used to fabricate SRAM devices having improved short-channel control, lower sub-threshold leakage, improved SRAM cell yield, and improved operation margin. Other embodiments and advantages will be evident to those skilled in the art upon reading the present disclosure.

For purposes of the discussion that follows, FIG. 1 provides a simplified top-down layout view of a multi-gate device 100. In various embodiments, the multi-gate device 100 may include a FinFET device, a GAA transistor, or other type of multi-gate device. The multi-gate device 100 may include a plurality of fin elements 104 extending from a substrate, a gate structure 108 disposed over and around the fin elements 104, and source/drain regions 105, 107, where the source/drain regions 105, 107 are formed in, on, and/or surrounding the fins 104. A channel region of the multi-gate device 100, which may include a plurality of semiconductor channel layers (e.g., when the multi-gate device 100 includes a GAA transistor), is disposed within the fins 104, underlying the gate structure 108, along a plane substantially parallel to a plane defined by section AA' of FIG. 1. In some embodiments, sidewall spacers may also be formed on sidewalls of the gate structure 108. Various other features of the multi-gate device 100 are discussed in more detail below with reference to the method of FIG. 2.

Figure 2:
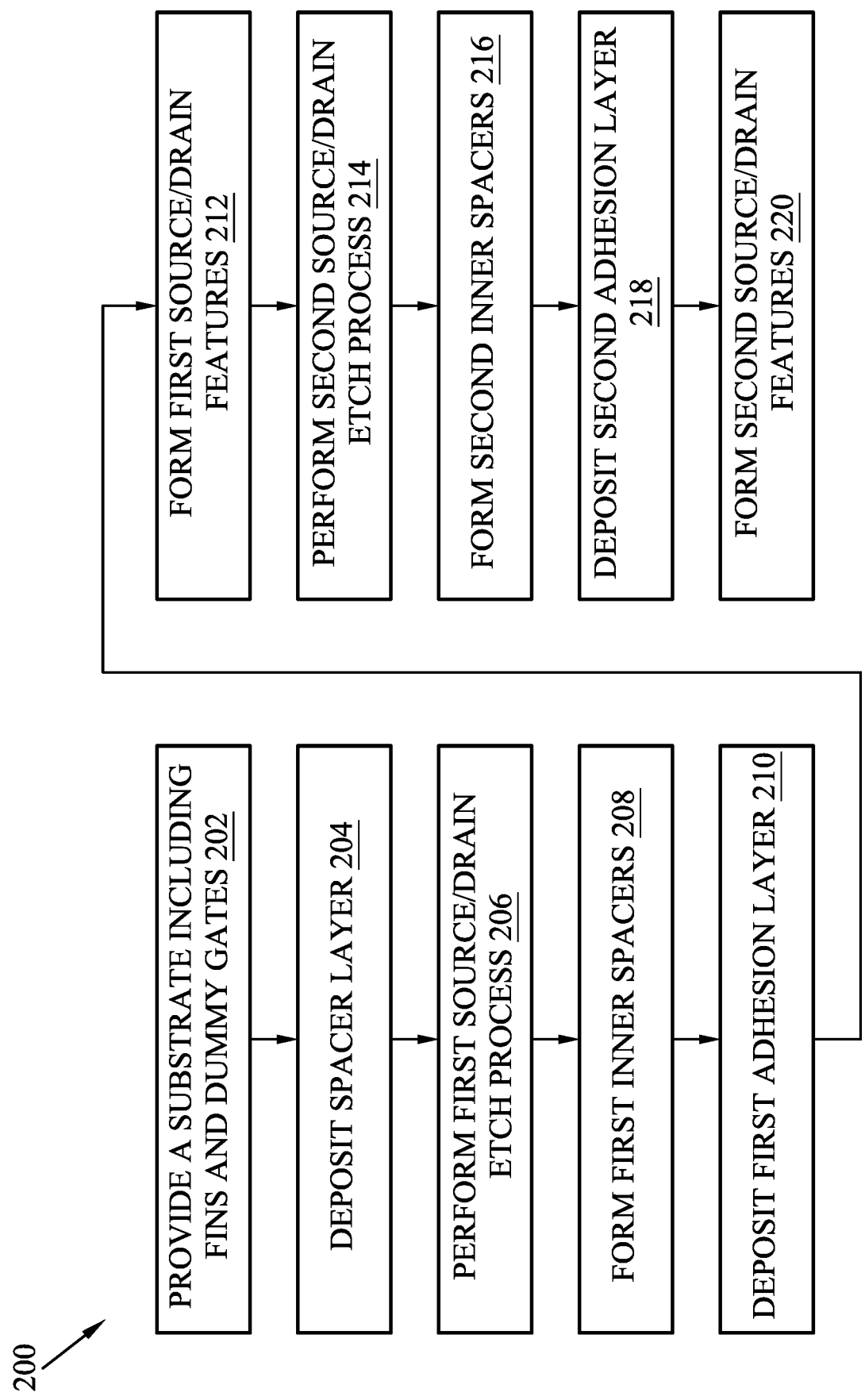
FIG. 2 is a flow chart of a method of fabricating a semiconductor device 300, according to one or more aspects of the present disclosure.

Referring to FIG. 2, illustrated therein is a method 200 of semiconductor fabrication including fabrication of a semiconductor device 300 (e.g., which includes a multi-gate device) having improved source/drain features, in accordance with various embodiments. The method 200 is discussed below with reference to fabrication of GAA transistors which may be used to implement SRAM devices. However, it will be understood that aspects of the method 200 may be equally applied to other types of multi-gate devices, or to other types of devices implemented by the multi-gate devices such as core (logic) devices, analog devices, or other types of devices, without departing from the scope of the present disclosure. In some embodiments, the method 200 may be used to fabricate the multi-gate device 100, described above with reference to FIG. 1. Thus, one or more aspects discussed above with reference to the multi-gate device 100 may also apply to the method 200. It is understood that the method 200 includes steps having features of a complementary metal-oxide-semiconductor (CMOS) technology process flow and thus, are only described briefly herein. Also, additional steps may be performed before, after, and/or during the method 200.

In addition, the semiconductor device 300 may include various other devices and features, such as other types of devices such as additional transistors, bipolar junction transistors, resistors, capacitors, inductors, diodes, fuses and/or other logic circuits, etc., but is simplified for a better understanding of the inventive concepts of the present disclosure. In some embodiments, the semiconductor device 300 includes a plurality of semiconductor devices (e.g., transistors), including P-type transistors, N-type transistors, etc., which may be interconnected. Moreover, it is noted that the process steps of method 200, including any descriptions given with reference to the figures are merely exemplary and are not intended to be limiting beyond what is specifically recited in the claims that follow.

The method 200 begins at block 202 where a substrate including fins and dummy gates is provided. Referring to the example of FIGS. 3A/3B/3C, in an embodiment of block 202, a substrate 302 including fins 304 and dummy gate stacks 309, 311 is provided. FIG. 3A provides a cross-sectional view of an embodiment of the semiconductor device 300 along a plane substantially parallel to a plane defined by section BB' of FIG. 1 which traverses a source/drain region of the device 300. FIG. 3A also illustrates a P-type device region 305 and an N-type device region 307.

In some embodiments, the P-type device region 305 includes an SRAM P-type device region, and the N-type device region 307 includes an SRAM N-type device region. FIGS. 3B and 3C provide cross-sectional views of an embodiment of the semiconductor device 300 along a plane substantially parallel to a plane defined by section AA' of FIG. 1. In addition, FIG. 3B illustrates the N-type device region 307, and FIG. 3C illustrates the P-type device region 305. In some embodiments, the substrate 302 may be a semiconductor substrate such as a silicon substrate. The substrate 302 may include various layers, including conductive or insulating layers formed on a semiconductor substrate. The substrate 302 may include various doping configurations depending on design requirements as is known in the art. The substrate 302 may also include other semiconductors such as germanium, silicon carbide (SiC), silicon germanium (SiGe), or diamond. Alternatively, the substrate 302 may include a compound semiconductor and/or an alloy semiconductor. Further, the substrate 302 may optionally include an epitaxial layer (epi-layer), may be strained for performance enhancement, may include a silicon-on-insulator (SOI) structure, and/or have other suitable enhancement features.

The fins 304, which include layers 308 and 310, may be formed by growing epitaxial layers of a first composition (e.g., which are subsequently patterned to form the layers 310) interposed by epitaxial layers of a second composition (e.g., which are subsequently patterned to form the layers 308). In an embodiment, the epitaxial layers of the first composition (e.g., used to form layers 310) are SiGe and the epitaxial layers of the second composition (e.g., used to form layers 308) are silicon (Si). However, other embodiments are possible including those that provide for a first composition and a second composition having different oxidation rates and/or etch selectivity. For example, in some embodiments, either of the epitaxial layers of the first composition or the second composition may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. By way of example, epitaxial growth of the epitaxial layers of the first composition or the second composition may be performed by a molecular beam epitaxy (MBE) process, a metalorganic chemical vapor deposition (MOCVD) process, and/or other suitable epitaxial growth processes. It is also noted that while the layers 308, 310 are shown as having a particular stacking sequence within the fins 304, where the layer 308 is the topmost layer of the stack of layers 308, 310, other configurations are possible. For example, in some cases, the layer 310 may alternatively be the topmost layer of the stack of layers 308, 310. Stated another way, the order of growth for the layers 308, 310, and thus their stacking sequence, may be switched or otherwise be different than what is shown in the figures, while remaining within the scope of the present disclosure.

The fins 304 may be fabricated using suitable processes including photolithography and etch processes. The photolithography process may include forming a photoresist layer over the device 300, exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 302, and layers formed thereupon, while a wet and/or dry etch process forms trenches in unprotected regions through the epitaxial layers of the first composition and the second composition, and into the substrate 302, thereby leaving the plurality of extending fins 304.

In various embodiments, each of the fins 304 includes a substrate portion 302A formed from the substrate 302, the layers 310 (e.g., including the first composition), and the layers 308 (e.g., including the second composition). In some examples, the epitaxial layers 308 (e.g., including the second composition), or portions thereof, may form a channel region of a GAA transistor of the device 300. For example, the layers 308 may be referred to as semiconductor channel layers that are used to form a channel region of a GAA transistor. In various embodiments, the semiconductor channel layers (e.g., the layers 308 or portions thereof) may include nanosheet channel(s), nanowire channel(s), bar-shaped channel(s), and/or other suitable channel configurations.

It is noted that while the fins 304 are illustrated as including three (3) layers of the epitaxial layer 310 and three (3) layers of the epitaxial layer 308, this is for illustrative purposes only and not intended to be limiting beyond what is specifically recited in the claims. It can be appreciated that any number of epitaxial layers can be formed, where for example, the number of epitaxial layers depends on the desired number of semiconductor channel layers for the GAA transistor. In some examples, the number of epitaxial layers, and thus the number of semiconductor channel layers, is selected based on the device type being implemented by the GAA transistor (e.g., such as core (logic) devices, SRAM devices, or analog devices, among others). In some embodiments, the number of epitaxial layers 308, and thus the number of semiconductor channel layers, is between 3 and 10.

In some embodiments, the epitaxial layers 310 each have a thickness range of about 4-8 nanometers (nm). In some cases, the epitaxial layers 308 each have a thickness range of about 4-8 nm. As noted above, the epitaxial layers 308 may serve as channel region(s) for a subsequently-formed multi-gate device (e.g., a GAA transistor) and its thickness may be chosen based at least in part on device performance considerations. The epitaxial layers 310 may serve to define a gap distance between adjacent channel region(s) for the subsequently-formed multi-gate device and its thickness may also be chosen based at least in part on device performance considerations.

In a further embodiment of block 202, and still with reference to FIGS. 3A/3B/3C, recessed shallow trench isolation (STI) features 312 are formed interposing the fins 304. In some examples, after forming the fins 304, the trenches interposing the fins 304 may be filled with a dielectric material. In some embodiments, the dielectric material used to fill the trenches may include $SiO_2$, silicon nitride, silicon oxynitride, fluorine-doped silicate glass (FSG), a low-k dielectric, combinations thereof, and/or other suitable materials known in the art. In various examples, the dielectric material may be deposited by a CVD process, a subatmospheric CVD (SACVD) process, a flowable CVD process, an ALD process, a PVD process, and/or other suitable process.

After depositing the dielectric material, a CMP process may be performed to remove excess portions of the dielectric material and to planarize a top surface of the device 300, and an STI recess process (e.g., including a wet and/or dry etch process) is performed to recess the dielectric material between the fins 304 and form recessed STI features 312. In various examples, the fins 304 extend above the recessed STI features 312 such that the epitaxial stack of layers 308, 310 of each of the fins 304 is exposed.

In a further embodiment of block 202, and still referring to FIGS. 3A/3B/3C, dummy gates are formed. While the present discussion is directed to a replacement gate (gate-last) process whereby a dummy gate structure is formed and subsequently replaced, other configurations may be possible. In some embodiments, gate stacks 309, 311 are formed over the fins 304 of the semiconductor device 300. In an embodiment, the gate stacks 309, 311 are dummy (sacrificial) gate stacks that are subsequently removed and replaced by the final gate stack at a subsequent processing stage of the device 300, as discussed below. The gate stacks 309, 311 may be replaced at a later processing stage by a high-K dielectric layer (HK) and metal gate electrode (MG). In some embodiments, the gate stacks 309, 311 are formed over the substrate 302 and are at least partially disposed over the fins 304 of the semiconductor device 300. The portion of the fins 304 underlying the gate stacks 309, 311 may be referred to as the channel region. The gate stacks 309, 311 may also define a source/drain region of the fins 304, for example, as the regions of the fins 304 adjacent to and on opposing sides of the channel region. In some embodiments, sidewall spacers may also be formed on sidewalls of the gate stacks 309, 311, as discussed below.

In some embodiments, the gate stacks 309, 311 include a dielectric layer and an electrode layer 312 over the dielectric layer. The gate stacks 309, 311 may also include one or more hard mask layers 314, 316. In some embodiments, the hard mask layer 314 may include a nitride layer, and the hard mask layer 316 may include an oxide layer. In some embodiments, the gate stacks 309, 311 are formed by various process steps such as layer deposition, patterning, etching, as well as other suitable processing steps. In some examples, the layer deposition process includes CVD (including both low-pressure CVD and plasma-enhanced CVD), PVD, ALD, thermal oxidation, e-beam evaporation, or other suitable deposition techniques, or a combination thereof. In forming the gate stacks 309, 311 for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

In some embodiments, the dielectric layer of the gate stacks 309, 311 includes silicon oxide. Alternatively, or additionally, the dielectric layer may include silicon nitride, a high-K dielectric material or other suitable material. In some embodiments, the electrode layer 312 may include polycrystalline silicon (polysilicon). In some embodiments, the nitride of the hard mask layer 314 includes a pad nitride layer that may include $Si_3N_4$, silicon oxynitride or silicon carbide. In some embodiments, the oxide of the hard mask layer 316 includes a pad oxide layer that may include $SiO_2$.

The method then proceeds to block 204 where a spacer layer is deposited. In particular, the spacer layer may be deposited after formation of the gate stacks 309, 311. Referring to the example of FIGS. 4A/4B/4C, in an embodiment of block 204, a spacer layer 402 is deposited over the device 300. FIG. 4A provides a cross-sectional view of an embodiment of the device 300 along a plane substantially parallel to a plane defined by section BB' of FIG. 1 (traversing the source/drain region of the device 300), and FIGS. 4B/4C provide cross-sectional views of an embodiment of the device 300 along a plane substantially parallel to a plane defined by section AA' of FIG. 1. FIGS. 4A/4B/4C also illustrate the N-type device region 307 and the P-type device region 305, discussed above, showing that the spacer layer 402 may be deposited over both the N-type device region 307 and the P-type device region 305. In some embodiments, the spacer layer 402 may be a conformal layer. The spacer layer 402 may be deposited over and on sidewalls of the gate stacks 309, 311, as well as over and on sidewalls of the fins 304. In some cases, the spacer layer 402 may have a thickness of about 2-10 nm. In some examples, the spacer layer 402 may include a dielectric material such as silicon oxide, silicon nitride, silicon carbide, silicon oxynitride, SiCN, silicon oxycarbide, SiOCN, a low-K material (e.g., with a dielectric constant 'k'<7), and/or combinations thereof. In some embodiments, the spacer layer 402 includes multiple layers, such as a spacer layer 402A and a spacer layer 402B formed over the spacer layer 402A, which may include main spacer layers, liner layers, and the like. By way of example, the spacer layer 402 may be formed by conformally depositing a dielectric material over the device 300 using processes such as a CVD process, a subatmospheric CVD (SACVD) process, a flowable CVD process, an ALD process, a PVD process, or other suitable process.

The method 200 then proceeds to block 206 where a first source/drain etch process is performed. With reference to FIGS. 5A/5B/5C, in an embodiment of block 206, a first source/drain etch process is performed to etch the epitaxial stack of layers 308, 310 within source/drain regions of the P-type device region 305. FIG. 5A provides a cross-sectional view of an embodiment of the device 300 along a plane substantially parallel to a plane defined by section BB' of FIG. 1 (traversing the source/drain region of the device 300), and FIGS. 5B/5C provide cross-sectional views of an embodiment of the device 300 along a plane substantially parallel to a plane defined by section AA' of FIG. 1. In some embodiments, and prior to etching the epitaxial stack of layers 308, 310 within source/drain regions of the P-type device region 305, a patterned hard mask (HM) layer may be formed to expose the spacer layer 402 in the P-type device region 305, while the N-type device region 307 remains covered by the patterned HM layer. A fin sidewall etching process may then be performed to remove portions of the spacer layer 402 from over portions of the sidewalls of the fins 304 (in the P-type device region 305), thereby exposing the epitaxial stack of layers 308, 310 of the fins 304 in source/drain regions of the P-type device region 305. The fin sidewall etching process may also remove portions of the spacer layer 402 from top surfaces of the gate stacks 309 and from top surfaces of the epitaxial stack of layers 308, 310 between adjacent gate stacks 309 (e.g., in source/drain regions) within the P-type device region 305. Thereafter, and in a further embodiment of block 206, the first source/drain etch process is performed to remove the exposed epitaxial layers 308, 310 in source/drain regions of the P-type device region 305 to form trenches 702 which expose underlying substrate portions 302A of the fins 304 in the P-type device region 305 while the N-type device region 307 remains masked by the patterned HM layer. In some embodiments, the first source/drain etch process may include a dry etching process, a wet etching process, and/or a combination thereof. After performing the first source/drain etch process, and in some embodiments, the patterned HM layer may be removed.

The method 200 then proceeds to block 208 where first inner spacers are formed. Referring to the example of FIGS. 6A/6B/6C, in an embodiment of block 208, first inner spacers are formed in the P-type device region 305 of the device 300. FIG. 6A provides a cross-sectional view of an embodiment of the device 300 along a plane substantially parallel to a plane defined by section BB' of FIG. 1 (traversing the source/drain region of the device 300), and FIGS. 6B/6C provide cross-sectional views of an embodiment of the device 300 along a plane substantially parallel to a plane defined by section AA' of FIG. 1. In some embodiments, initially a lateral etch of the epitaxial layers 310 (SiGe layers) may be performed to form recesses along sidewalls of the trenches 702. Thereafter, in some examples, an inner spacer material layer may be deposited conformally over the device 300, including within the recesses formed along sidewalls of the trenches 702 within the P-type device region 305. In some examples, the inner spacer material layer may include a dielectric material such as SiCNx. More generally, and in various examples, the inner spacer material layer may include silicon oxide, silicon nitride, silicon carbide, silicon oxynitride, SiCN, silicon oxycarbide, SiOCN, a low-K material (e.g., with a dielectric constant 'k'<7), and/or combinations thereof. In some embodiments, the inner spacer material layer may include amorphous silicon. By way of example, the inner spacer material layer may be formed by conformally depositing a dielectric material over the device 300 using processes such as a CVD process, an SACVD process, a flowable CVD process, an ALD process, a PVD process, or other suitable process.

After deposition of the inner spacer material layer, and in a further embodiment of block 208, an etch-back process may be performed. In some embodiments, the etch-back process substantially removes the inner spacer material layer from the device 300, except for portions of the inner spacer material layer that remain disposed within the recesses formed along sidewalls of the trenches 702 after the etch-back process and which define inner spacers 1102 for the P-type device region 305. In various examples, the inner spacers 1102 may extend beneath sidewall spacers of the gate stacks 309, and optionally at least partially beneath the electrode layer 312 of the gate stacks 309 (e.g., depending on the size of the recesses formed along sidewalls of the trenches 702), while abutting subsequently formed source/drain features, described below.

The method 200 then proceeds to block 210 where a first adhesion layer is deposited. Still referring to the example of FIGS. 6A/6B/6C, in an embodiment of block 210, the first adhesion layer is deposited in the P-type device region 305 of the device 300 after formation of the first inner spacers (block 208). In some embodiments, the first adhesion layer is deposited using a CVD process. However, in some cases, other process may be used to deposit the first adhesion layer such as an ALD process, or other suitable process. In various embodiments, the first adhesion layer may be deposited by flowing a precursor gas 1104 (e.g., as part of a CVD process) into a processing chamber housing the device 300. In some embodiments, while both the N-type device region 307 and the P-type device region 305 of the device 300 may be exposed to the precursor gas 1104, the N-type device region 307 remains protected from the precursor gas (e.g., by the spacer layer 402).

In contrast, and in various examples, the precursor gas 1104 may diffuse to, and be adsorbed onto, surfaces within the P-type device region 305 that are not covered by the spacer layer 402. For instance, in some examples, the precursor gas 1104 may diffuse to, and be adsorbed onto, sidewall surfaces of the trenches 702 within the P-type device region 305. In particular, the precursor gas 1104 may diffuse to, and be adsorbed onto, exposed surfaces of the epitaxial layers 308 and the inner spacers 1102. As a result, an adhesion layer is formed over the exposed surfaces of the epitaxial layers 308 (Si) and the exposed surfaces of the adjacent inner spacers 1102 (SiN) to provide a uniform (conformal) base layer within the source/drain region of the P-type device region 305 prior to subsequent source/drain epitaxial layer growth. In some examples, the precursor gas used to form the adhesion layer within the P-type device region 305 includes a di-borane based material (e.g., a di-borane gas) including $B_2H_x$ or $SiB_2H_x$. In some embodiments, deposition of the adhesion layer within the P-type device region 305 may be performed at a deposition pressure of between about 10-30 Torr, at a deposition temperature of between about 600-800 degrees Celsius, and for a deposition time of between about 20-50 seconds. In some embodiments, the deposition parameters (e.g., pressure, temperature, and time) for the adhesion layer are selected to ensure uniform (conformal) deposition of the adhesion layer. In some cases, the di-borane based material may form a stronger bond to the inner spacers 1102 (SiN) than to the epitaxial layers 308 (Si). However, the bond between the di-borane based material and each of the inner spacers 1102 and the epitaxial layers 308 is strong enough to form a substantially continuous adhesion layer, as discussed below.

Figures 11A, 11B:
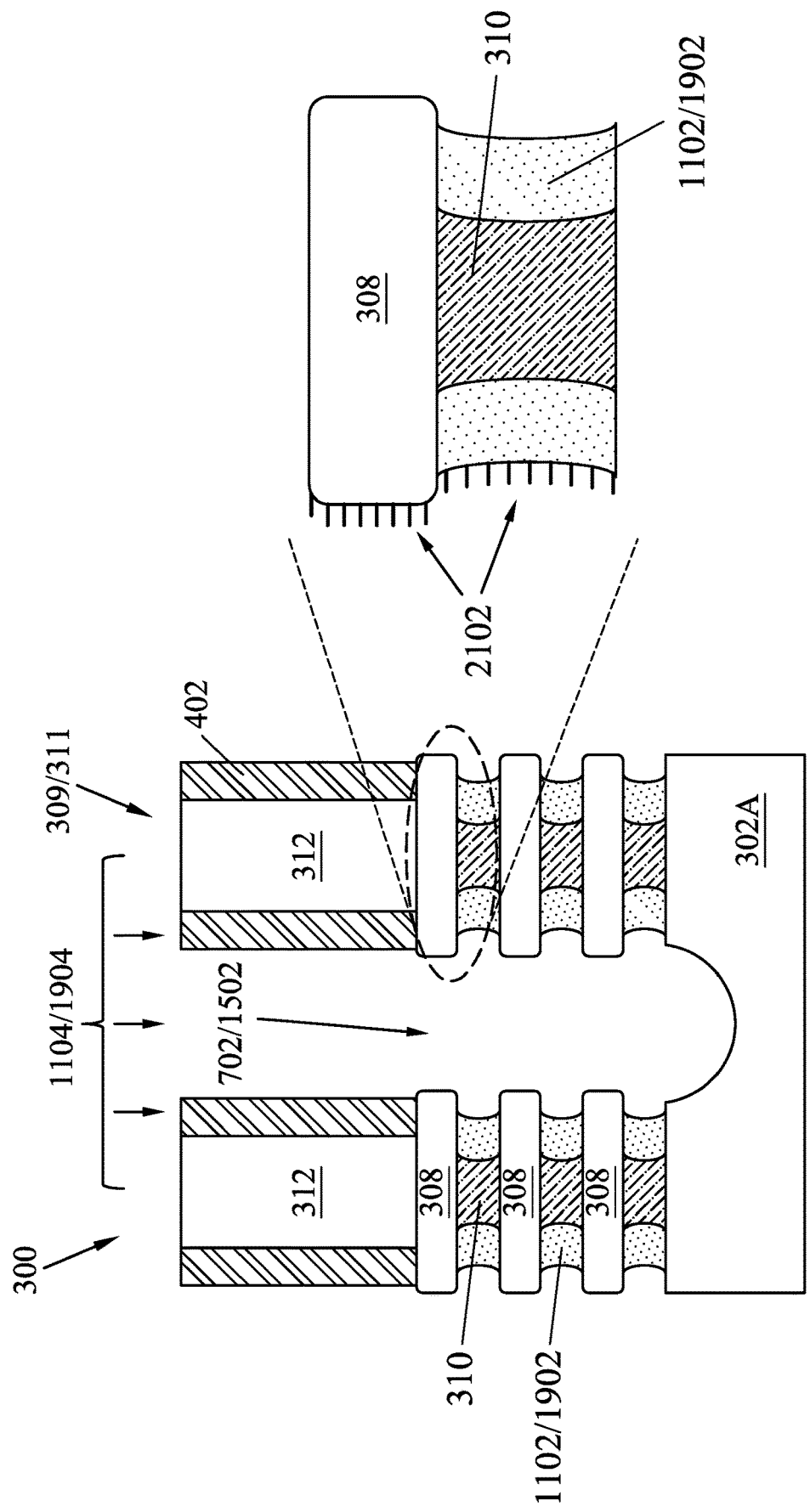
FIG. 11A and FIG. 12 provide views of a section of FIG. 6C and FIG. 9B, in accordance with some embodiments.
FIGS. 11B/11C/11D provide zoomed-in views of a portion of the device 300 of FIG. 11A, according to some embodiments.

To provide further detail regarding the formation of the adhesion layer, reference is made to FIGS. 11A/11B/11C. The example of FIG. 11A generally provides a view of a section 1106 of FIG. 6C, showing the gate stacks 309 including the electrode layer 312 and sidewall spacer layers 402 on sidewalls of the gate stacks 309. FIG. 11A also illustrates the epitaxial layers 308, 310, the inner spacers 1102, the trench 702, and the precursor gas 1104 used to form the adhesion layer. The examples of FIGS. 11B/11C provide zoomed-in views of a portion of the device 300 of FIG. 11A, the illustrated portion including the epitaxial layer 308 and the inner spacers 1102, which collectively define a portion of the sidewall surface of the trench 702. In particular, FIG. 11B illustrates adsorbed precursor material 2102 resulting from the flow of the precursor gas 1104 onto exposed surfaces of the epitaxial layers 308 and the inner spacers 1102. While FIG. 11B illustrates the adsorbed precursor material 2102 schematically as individually adsorbed portions of the precursor gas 1104, FIG. 11C illustrates the adsorbed precursor material 2102 as a substantially continuous adhesion layer 2104 formed over the exposed surfaces of the epitaxial layers 308 (Si) and the exposed surfaces of the adjacent inner spacers 1102 (SiN). As discussed further herein, a subsequently formed source/drain epitaxial layer will grow over the adhesion layer 2104 along both Si channel layer surfaces (e.g., the epitaxial layers 308) and SiN inner spacer layer surfaces (e.g., the inner spacers 1102), resulting in a continuous source/drain epitaxial layer and effectively overcoming the epitaxial merge issue.

Figures 7A, 7B, 7C:
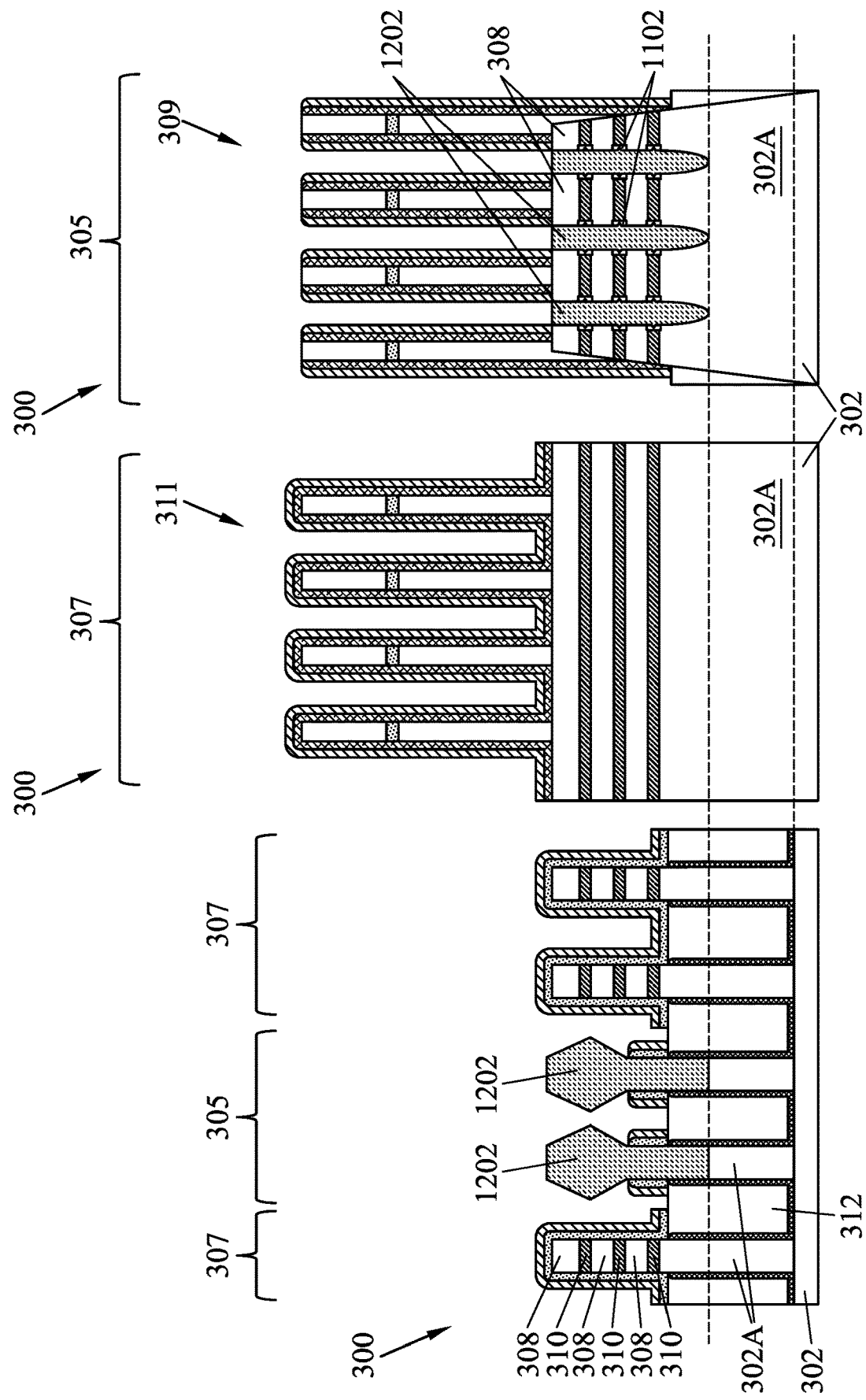

The method 200 then proceeds to block 212 where first source/drain features are formed. With reference to FIGS. 7A/7B/7C, in an embodiment of block 212, source/drain features 1202 are formed in the P-type device region 305 of the semiconductor device 300. FIG. 7A provides a cross-sectional view of an embodiment of the device 300 along a plane substantially parallel to a plane defined by section BB' of FIG. 1 (traversing the source/drain region of the device 300), and FIGS. 7B/7C provide cross-sectional views of an embodiment of the device 300 along a plane substantially parallel to a plane defined by section AA' of FIG. 1. In some embodiments, the source/drain features 1202 are formed in source/drain regions adjacent to and on either side of the gate stacks 309 in the P-type device region 305. For example, the source/drain features 1202 may be formed within the trenches 702 of the P-type device region 305 and over the conformal adhesion layer (e.g., such as the adhesion layer 2104) previously formed over the exposed surfaces of the epitaxial layers 308 (Si) and the exposed surfaces of the adjacent inner spacers 1102 (SiN). Formation of the adhesion layer prior to formation of the source/drain features 1202 effectively mitigates the epitaxial merge issue, as previously discussed.

In some embodiments, the source/drain features 1202 are formed by epitaxially growing one or more semiconductor material layers in the source/drain regions. In general, the one or more semiconductor material layers grown to form source/drain features for the device 300 may include Ge, Si, GaAs, AlGaAs, SiGe, GaAsP, SiP, SiB, SiGeBx, SiAs, SiPAsx, SiC, SiCP, or other suitable material. Source/drain features (e.g., such as the source/drain features 1202) may be formed by one or more epitaxial (epi) processes, and in some cases, may be in-situ doped during the epi growth process. By way of example, and in some embodiments, P-type source/drain features (e.g., such as the source/drain features 1202) formed within the P-type device region 305 may include SiGe or a boron-doped epitaxial layer such as SiB or SiGeBx. In some embodiments, the source/drain features 1202 are not in-situ doped, and instead an implantation process is performed to dope the source/drain features 1202. In addition, and in some cases, silane ($SiH_4$) may be used for the epitaxial layer growth of source/drain features 1202.

In at least some examples, the source/drain features 1202 may be formed using multiple epitaxially grown layers. For instance, in some embodiments, a first source/drain layer of the source/drain features 1202 may include a lower-doped layer (e.g., such as lightly boron-doped SiGe for the P-type source/drain features 1202) to prevent out-diffusion and/or suppress leakage current, and a second source/drain layer of the source/drain features 1202 may include a higher-doped layer (e.g., heavily boron-doped SiGe) to reduce source/drain contact resistance. In cases where the epitaxial growth of the source/drain layers is performed directly onto the exposed surfaces of the epitaxial layers 308 (Si) and the exposed surfaces of the adjacent inner spacers 1102 (SiN), the first source/drain layer of the source/drain features 1202 may fail to form a continuous layer within a source/drain region (e.g., due to the epitaxial merge issue, discussed above). Alternatively, in some embodiments and as a result of the adhesion layer, the source/drain features 1202 (e.g., the first source/drain layer of the source/drain features 1202) are grown over the adhesion layer along both Si channel layer surfaces (epitaxial layers 308) and SiN inner spacer layer surfaces (inner spacers 1102), resulting in a continuous first source/drain layer and effectively overcoming the epitaxial merge issue.

Figure 12:
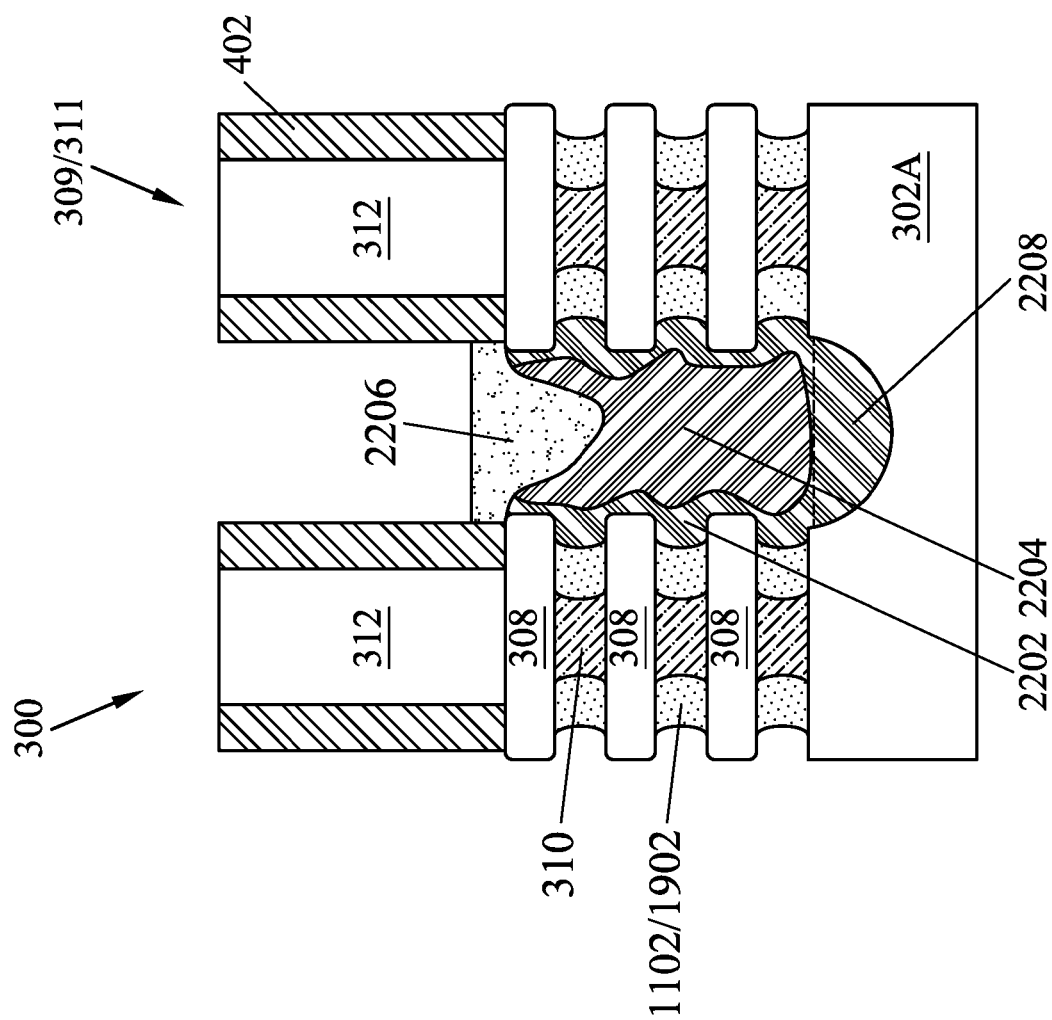

To provide further detail regarding the formation of the multiple epitaxially grown layers over the adhesion layer, reference is made to FIG. 11D and FIG. 12. The example of FIG. 11D provides a zoomed-in view of a portion of the device 300 of FIG. 11A, similar to the zoomed-in views of FIGS. 11B/11C, discussed above. In particular, FIG. 11D illustrates the portion of the device 300 after the formation of multiple epitaxially grown source/drain layers including a source/drain layer 2106 and a source/drain layer 2108. As shown, the source/drain layer 2106 is a continuous layer formed directly over the continuous adhesion layer 2104, where the adhesion layer 2104 was previously formed over the exposed surfaces of the epitaxial layers 308 (Si) and the exposed surfaces of the adjacent inner spacers 1102 (SiN). The source/drain layer 2106 may be the first source/drain layer, discussed above, and a second source/drain layer (e.g., the source/drain layer 2108) may subsequently be formed over the first source/drain layer (e.g., the source/drain layer 2106) to form a source/drain feature (e.g., such as the source/drain features 1202) having multiple epitaxial layers. In some embodiments, the source/drain layer 2106 is a substantially conformal layer that follows the surface contours of the adhesion layer 2104.

The example of FIG. 12, like the example of FIG. 11A, generally provides a view of a section 1106 of FIG. 6C, showing the gate stacks 309 including the electrode layer 312 and sidewall spacer layers 402 on sidewalls of the gate stacks 309. FIG. 12 also illustrates the epitaxial layers 308, 310, the inner spacers 1102, a first source/drain layer 2202, a second source/drain layer 2204, and a silicide layer 2206. In some embodiments, the first source/drain layer 2202 may be the source/drain layer 2106, discussed above. Likewise, the second source/drain layer 2204 may be the source/drain layer 2108, discussed above. Also, in various examples, the first source/drain layer 2202 may be referred to as layer "L1", and the second source/drain layer 2204 may be referred to as layer "L2". In some cases, a source/drain layer 2208, which may be referred to as layer "L0", may include a separate epitaxial layer formed prior to the first source/drain layer 2202 (layer "L1") and the second source/drain layer 2204. In some embodiments, the layers L0 and L1 may include a lower-doped layer (e.g., such as lightly boron-doped SiGe for the P-type source/drain features 1202) to prevent out-diffusion and/or suppress leakage current, and the layer L2 may include a higher-doped layer (e.g., heavily boron-doped SiGe) to reduce source/drain contact resistance. In some cases, the layer L0 may additionally or alternatively include a SiC layer to suppress leakage current. Additional discussion regarding the layers "L0", "L1", and "L2" is provided below with reference to FIGS. 13A/13B/13C.

While the example of the source/drain layer 2106 is illustrated and described as a substantially conformal layer that follows the surface contours of the adhesion layer 2104, the example of the first source/drain layer 2202 illustrates an alternative embodiment including an irregular profile of the first source/drain layer 2202 that generally follows the contours of the sidewall surface collectively defined by the epitaxial layers 308 and the inner spacers 1102. As shown, and in some examples, a portion of the second source/drain layer 2204 that interfaces the first source/drain layer 2202 may substantially follow the irregular profile of the first source/drain layer 2202. Stated another way, in some embodiments, both the first source/drain layer 2202 and the second source/drain layer 2204 may have the irregular profile. Nevertheless, even if the first source/drain layer 2202 has such an irregular profile, embodiments of the present disclosure provide for maintaining the first source/drain layer 2202 as a continuous layer. As previously noted, source/drain layer continuity may be achieved by forming an adhesion layer (e.g., such as the adhesion layer 2104) interposing the first source/drain layer 2202 and the adjacent Si channel layer surfaces (epitaxial layers 308) and SiN inner spacer layer surfaces (inner spacers 1102). As a result, the epitaxial merge issue is mitigated.

The method 200 then proceeds to block 214 where a second source/drain etch process is performed. With reference to FIGS. 8A/8B/8C, in an embodiment of block 214, a second source/drain etch process is performed to etch the epitaxial stack of layers 308, 310 within source/drain regions of the N-type device region 307. FIG. 8A provides a cross-sectional view of an embodiment of the device 300 along a plane substantially parallel to a plane defined by section BB' of FIG. 1 (traversing the source/drain region of the device 300), and FIGS. 8B/8C provide cross-sectional views of an embodiment of the device 300 along a plane substantially parallel to a plane defined by section AA' of FIG. 1. In some embodiments, and prior to etching the epitaxial stack of layers 308, 310 within source/drain regions of the N-type device region 307, a patterned HM layer may be formed to expose the spacer layer 402 in the N-type device region 307, while the P-type device region 305 remains covered by the patterned HM layer. A fin sidewall etching process may then be performed to remove portions of the spacer layer 402 from over portions of the sidewalls of the fins 304 (in the N-type device region 307), thereby exposing the epitaxial stack of layers 308, 310 of the fins 304 in source/drain regions of the N-type device region 307. The fin sidewall etching process may also remove portions of the spacer layer 402 from top surfaces of the gate stacks 311 and from top surfaces of the epitaxial stack of layers 308, 310 between adjacent gate stacks 311 (e.g., in source/drain regions) within the N-type device region 307. It is noted that in some embodiments, and prior to forming the patterned HM layer, a nitride layer 1310 (e.g., such as SiNx) may be formed over the P-type source/drain features 1202 to protect the P-type source/drain features 1202 from oxidation. In various cases, the nitride layer 1310 may be removed after formation of N-type source/drain features, as discussed below. In a further embodiment of block 214, the second source/drain etch process is performed to remove the exposed epitaxial layers 308, 310 in source/drain regions of the N-type device region 307 to form trenches 1502 which expose underlying substrate portions 302A of the fins 304 in the N-type device region 307 while the P-type device region 305 remains masked by the patterned HM layer. In some embodiments, the second source/drain etch process may include a dry etching process, a wet etching process, and/or a combination thereof. After performing the second source/drain etch process, and in some embodiments, the patterned HM layer may be removed.

The method 200 then proceeds to block 216 where second inner spacers are formed. Referring to the example of FIGS. 9A/9B/9C, in an embodiment of block 216, second inner spacers are formed in the N-type device region 307 of the device 300. FIG. 9A provides a cross-sectional view of an embodiment of the device 300 along a plane substantially parallel to a plane defined by section BB' of FIG. 1 (traversing the source/drain region of the device 300), and FIGS. 9B/9C provide cross-sectional views of an embodiment of the device 300 along a plane substantially parallel to a plane defined by section AA' of FIG. 1. In some embodiments, initially a lateral etch of the epitaxial layers 310 (SiGe layers) may be performed to form recesses along sidewalls of the trenches 1502. Thereafter, in some examples, an inner spacer material layer may be deposited conformally over the device 300, including within the recesses formed along sidewalls of the trenches 1502 within the N-type device region 307. In some examples, the inner spacer material layer may include a dielectric material such as SiCNx. More generally, and in various examples, the inner spacer material layer may include silicon oxide, silicon nitride, silicon carbide, silicon oxynitride, SiCN, silicon oxycarbide, SiOCN, a low-K material (e.g., with a dielectric constant 'k'<7), and/or combinations thereof. In some embodiments, the inner spacer material layer may include amorphous silicon. By way of example, the inner spacer material layer may be formed by conformally depositing a dielectric material over the device 300 using processes such as a CVD process, an SACVD process, a flowable CVD process, an ALD process, a PVD process, or other suitable process.

After deposition of the inner spacer material layer, and in a further embodiment of block 216, an etch-back process may be performed. In some embodiments, the etch-back process substantially removes the inner spacer material layer from the device 300, except for portions of the inner spacer material layer that remain disposed within the recesses formed along sidewalls of the trenches 1502 after the etch-back process and which define inner spacers 1902 for the N-type device region 307. In various examples, the inner spacers 1902 may extend beneath sidewall spacers of the gate stacks 311, and optionally at least partially beneath the electrode layer 312 of the gate stacks 311 (e.g., depending on the size of the recesses formed along sidewalls of the trenches 1502), while abutting subsequently formed source/drain features, described below.

The method 200 then proceeds to block 218 where a second adhesion layer is deposited. Still referring to the example of FIGS. 9A/9B/9C, in an embodiment of block 218, the second adhesion layer is deposited in the N-type device region 307 of the device 300 after formation of the second inner spacers (block 216). In some embodiments, the second adhesion layer is deposited using a CVD process. However, in some cases, other process may be used to deposit the second adhesion layer such as an ALD process, or other suitable process. In various embodiments, the second adhesion layer may be deposited by flowing a precursor gas 1904 (e.g., as part of a CVD process) into a processing chamber housing the device 300. In some embodiments, while both the N-type device region 307 and the P-type device region 305 of the device 300 may be exposed to the precursor gas 1904, the P-type device region 305 remains protected from the precursor gas (e.g., by the nitride layer 1310 and the spacer layer 402).

In contrast, and in various examples, the precursor gas 1904 may diffuse to, and be adsorbed onto, surfaces within the N-type device region 307 that are not covered by either the spacer layer 402 or the nitride layer 1310. For instance, in some examples, the precursor gas 1904 may diffuse to, and be adsorbed onto, sidewall surfaces of the trenches 1502 within the N-type device region 307. In particular, the precursor gas 1904 may diffuse to, and be adsorbed onto, exposed surfaces of the epitaxial layers 308 and the inner spacers 1902. As a result, an adhesion layer is formed over the exposed surfaces of the epitaxial layers 308 (Si) and the exposed surfaces of the adjacent inner spacers 1902 (SiN) to provide a uniform (conformal) base layer within the source/drain region of the N-type device region 307 prior to subsequent source/drain epitaxial layer growth. In some examples, the precursor gas used to form the adhesion layer within the N-type device region 307 includes a di-phosphorous based material (e.g., a di-phosphorous gas) including $P_2H_x$ or $SiP_2H_x$. In some embodiments, deposition of the adhesion layer within the N-type device region 307 may be performed at a deposition pressure of between about 10-30 Torr, at a deposition temperature of between about 600-800 degrees Celsius, and for a deposition time of between about 20-50 seconds. In some embodiments, the deposition parameters (e.g., pressure, temperature, and time) for the adhesion layer are selected to ensure uniform (conformal) deposition of the adhesion layer. In some cases, the di-phosphorous based material may form a stronger bond to the inner spacers 1902 (SiN) than to the epitaxial layers 308 (Si). However, the bond between the di-phosphorous based material and each of the inner spacers 1902 and the epitaxial layers 308 is strong enough to form a substantially continuous adhesion layer.

In various examples, the second adhesion layer formed at block 218 may be formed in substantially the same manner as the first adhesion layer (block 210). Thus, one or more aspects discussed above with reference to the first adhesion layer may also apply to the second adhesion layer. For example, and in some embodiments, previously discussed FIG. 11A may also generally provide a view of a section 1906 of FIG. 9B, showing the gate stacks 311 including the electrode layer 312 and sidewall spacer layers 402 on sidewalls of the gate stacks 311. FIG. 11A may also illustrate the epitaxial layers 308, 310, the inner spacers 1902, the trench 1502, and the precursor gas 1904 used to form the adhesion layer. As previously noted, FIGS. 11B/11C provide zoomed-in views of a portion of the device 300 of FIG. 11A, the illustrated portion including the epitaxial layer 308 and the inner spacers 1902, which collectively define a portion of the sidewall surface of the trench 1502. In particular, FIG. 11B illustrates adsorbed precursor material 2102 resulting from the flow of the precursor gas 1904 onto exposed surfaces of the epitaxial layers 308 and the inner spacers 1902. While FIG. 11B illustrates the adsorbed precursor material 2102 schematically as individually adsorbed portions of the precursor gas 1904, FIG. 11C illustrates the adsorbed precursor material 2102 as a substantially continuous adhesion layer 2104 formed over the exposed surfaces of the epitaxial layers 308 (Si) and the exposed surfaces of the adjacent inner spacers 1902 (SiN). As discussed herein, a subsequently formed source/drain epitaxial layer will grow over the adhesion layer 2104 along both Si channel layer surfaces (e.g., the epitaxial layers 308) and SiN inner spacer layer surfaces (e.g., the inner spacers 1902), resulting in a continuous source/drain epitaxial layer and effectively overcoming the epitaxial merge issue.

The method 200 then proceeds to block 220 where second source/drain features are formed. With reference to FIGS. 10A/10B/10C, in an embodiment of block 220, source/drain features 2002 are formed in the N-type device region 307 of the semiconductor device 300. FIG. 10A provides a cross-sectional view of an embodiment of the device 300 along a plane substantially parallel to a plane defined by section BB' of FIG. 1 (traversing the source/drain region of the device 300), and FIGS. 10B/10C provide cross-sectional views of an embodiment of the device 300 along a plane substantially parallel to a plane defined by section AA' of FIG. 1. In some embodiments, the source/drain features 2002 are formed in source/drain regions adjacent to and on either side of the gate stacks 311 in the N-type device region 307, while the source/drain features 1202 in the P-type device region 305 remain protected by the nitride layer 1310. For example, the source/drain features 2002 may be formed within the trenches 1502 of the N-type device region 307 and over the conformal adhesion layer (e.g., such as the adhesion layer 2104) previously formed over the exposed surfaces of the epitaxial layers 308 (Si) and the exposed surfaces of the adjacent inner spacers 1902 (SiN). Formation of the adhesion layer prior to formation of the source/drain features 2002 effectively mitigates the epitaxial merge issue, as previously discussed.

In some embodiments, the source/drain features 2002 are formed by epitaxially growing one or more semiconductor material layers in the source/drain regions. As previously noted, and in general, the one or more semiconductor material layers grown to form source/drain features for the device 300 may include Ge, Si, GaAs, AlGaAs, SiGe, GaAsP, SiP, SiB, SiGeBx, SiAs, SiPAsx, SiC, SiCP, or other suitable material. Source/drain features (e.g., such as the source/drain features 2002) may be formed by one or more epitaxial (epi) processes, and in some cases, may be in-situ doped during the epi growth process. By way of example, and in some embodiments, N-type source/drain features (e.g., such as the source/drain features 2002) formed within the N-type device region 307 may include SiP or an arsenic-doped epitaxial layer such as SiAs or SiPAsx. In some embodiments, the source/drain features 2002 are not in-situ doped, and instead an implantation process is performed to dope the source/drain features 2002. In addition, and in some cases, silane ($SiH_4$) may be used for the epitaxial layer growth of source/drain features 2002.

In at least some examples, the source/drain features 2002 may be formed using multiple epitaxially grown layers. For instance, similar to the source/drain features 1202 and in some embodiments, a first source/drain layer of the source/drain features 2002 may include a lower-doped layer (e.g., such as lightly arsenic-doped SiP for the N-type source/drain features 2002) to prevent out-diffusion and/or suppress leakage current, and a second source/drain layer of the source/drain features 2002 may include a higher-doped layer (e.g., heavily arsenic-doped SiP) to reduce source/drain contact resistance. In cases where the epitaxial growth of the source/drain layers is performed directly onto the exposed surfaces of the epitaxial layers 308 (Si) and the exposed surfaces of the adjacent inner spacers 1902 (SiN), the first source/drain layer of the source/drain features 2002 may fail to form a continuous layer within a source/drain region (e.g., due to the epitaxial merge issue, discussed above). Alternatively, in some embodiments and as a result of the adhesion layer, the source/drain features 2002 (e.g., the first source/drain layer of the source/drain features 2002) are grown over the adhesion layer along both Si channel layer surfaces (epitaxial layers 308) and SiN inner spacer layer surfaces (inner spacers 1902), resulting in a continuous first source/drain layer and effectively overcoming the epitaxial merge issue.

In various examples, the source/drain features 2002 formed at block 220 may be formed in substantially the same manner as the source/drain features 1202 (block 212). Thus, one or more aspects discussed above with reference to the source/drain features 1202 may also apply to the source/drain features 2002. For example, and in some embodiments, previously discussed FIG. 11D may also provide a zoomed-in view of a portion of the device 300 of FIG. 11A (e.g., which may provide a view of the section 1906 of FIG. 9B) similar to the zoomed-in views of FIGS. 11B/11C, discussed above. In particular, FIG. 11D illustrates the portion of the device 300 after the formation of multiple epitaxially grown source/drain layers including a source/drain layer 2106 and a source/drain layer 2108. As shown, the source/drain layer 2106 is a continuous layer formed directly over the continuous adhesion layer 2104, where the adhesion layer 2104 was previously formed over the exposed surfaces of the epitaxial layers 308 (Si) and the exposed surfaces of the adjacent inner spacers 1902 (SiN). The source/drain layer 2106 may be the first source/drain layer, discussed above, and a second source/drain layer (e.g., the source/drain layer 2108) may subsequently be formed over the first source/drain layer (e.g., the source/drain layer 2106) to form a source/drain feature (e.g., such as the source/drain features 2002) having multiple epitaxial layers. In some embodiments, the source/drain layer 2106 is a substantially conformal layer that follows the surface contours of the adhesion layer 2104.

Further, in some cases, the example of FIG. 12 may also generally provide a view of a section 1906 of FIG. 9B, showing the gate stacks 311 including the electrode layer 312 and sidewall spacer layers 402 on sidewalls of the gate stacks 311. FIG. 12 may also illustrate the epitaxial layers 308, 310, the inner spacers 1902, a first source/drain layer 2202, a second source/drain layer 2204, and a silicide layer 2206. In some embodiments, the first source/drain layer 2202 may be the source/drain layer 2106, discussed above. Likewise, the second source/drain layer 2204 may be the source/drain layer 2108, discussed above. As previously discussed, the first source/drain layer 2202 may be referred to as layer "L1", and the second source/drain layer 2204 may be referred to as layer "L2". Further, in some cases, a source/drain layer 2208 (layer "L0") may include a separate epitaxial layer formed prior to the first source/drain layer 2202 (layer "L1") and the second source/drain layer 2204 (layer "L2").

While the example of the source/drain layer 2106 is illustrated and described as a substantially conformal layer that follows the surface contours of the adhesion layer 2104, the example of the first source/drain layer 2202 illustrates an alternative embodiment including an irregular profile of the first source/drain layer 2202 that generally follows the contours of the sidewall surface collectively defined by the epitaxial layers 308 and the inner spacers 1902. As shown, and in some examples, a portion of the second source/drain layer 2204 that interfaces the first source/drain layer 2202 may substantially follow the irregular profile of the first source/drain layer 2202. Stated another way, in some embodiments, both the first source/drain layer 2202 and the second source/drain layer 2204 may have the irregular profile. Nevertheless, even if the first source/drain layer 2202 has such an irregular profile, embodiments of the present disclosure provide for maintaining the first source/drain layer 2202 as a continuous layer. As previously noted, source/drain layer continuity may be achieved by forming an adhesion layer (e.g., such as the adhesion layer 2104) interposing the first source/drain layer 2202 and the adjacent Si channel layer surfaces (epitaxial layers 308) and SiN inner spacer layer surfaces (inner spacers 1902). As a result, the epitaxial merge issue is mitigated.

Figures 13A, 13B, 13C:
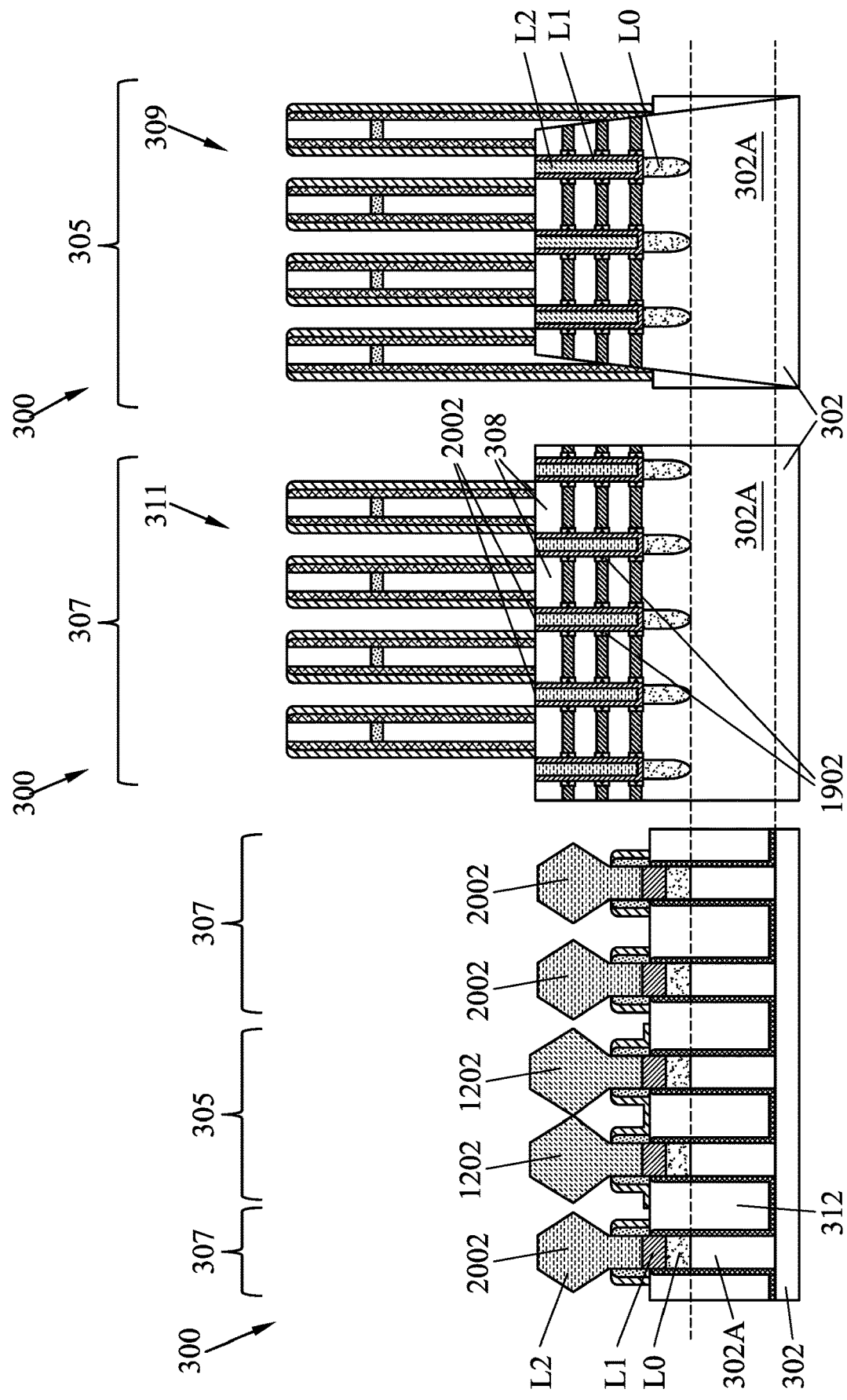

After formation of the source/drain features 2002, with reference to FIGS. 13A/13B/13C and in some embodiments, the nitride layer 1310 may be removed. FIG. 13A provides a cross-sectional view of an embodiment of the device 300 along a plane substantially parallel to a plane defined by section BB' of FIG. 1 (traversing the source/drain region of the device 300), and FIGS. 13B/13C provide cross-sectional views of an embodiment of the device 300 along a plane substantially parallel to a plane defined by section AA' of FIG. 1. In some embodiments, the nitride layer 1310 may be removed using a wet etch, a dry etch, or a combination thereof. Various aspects of the FIGS. 13A/13B/13C may be substantially the same as that shown in FIGS. 10A/10B/10C. However, by way of example, FIGS. 13A/13B/13C also schematically illustrate the layers "L0", "L1", and "L2", discussed above. In some embodiments, the layer "L0" includes a bottom portion of each of the source/drain features 1202 and the source/drain features 2002. In some examples, the layer "L1" includes a portion of each of the source/drain features 1202 and the source/drain features 2002 disposed above the layer "L0". The layer "L1" includes a continuous layer formed directly over the adhesion layer previously formed over the exposed surfaces of the epitaxial layers 308 (Si) and the exposed surfaces of the adjacent inner spacers (1102, 1902). In various embodiments, the layer "L2" includes a portion of each of the source/drain features 1202 and the source/drain features 2002 disposed over the layer "L1". In some embodiments, the layers L0 and L1 may include a lower-doped layer (e.g., such as lightly boron-doped SiGe for the P-type source/drain features 1202 or lightly arsenic-doped SiP for the N-type source/drain features 2002) to prevent out-diffusion and/or suppress leakage current, and the layer L2 may include a higher-doped layer (e.g., heavily boron-doped SiGe for the P-type source/drain features 1202 or heavily arsenic-doped SiP for the N-type source/drain features 2002) to reduce source/drain contact resistance. In some cases, the layer L0 may additionally or alternatively include a SiC layer to suppress leakage current.

Generally, the semiconductor device 300 may undergo further processing to form various features and regions known in the art. For example, subsequent processing may form inter-layer dielectric (ILD) layers, may remove the dummy gate stacks 309, 311, may perform a semiconductor channel release process (e.g., including selective removal of the epitaxial SiGe layers 310), and may form a high-K/metal gate stack, contact openings, contact metal, as well as various contacts/vias/lines and multilayer interconnect features (e.g., metal layers and interlayer dielectrics) on the substrate 302, configured to connect the various features to form a functional circuit that may include one or more multi-gate devices (e.g., one or more GAA transistors). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200. Further, while the method 200 has been shown and described as including the device 300 having a GAA transistor, it will be understood that other device configurations are possible. In some embodiments, the method 200 may be used to fabricate FinFET devices or other multi-gate devices.

Figure 14:
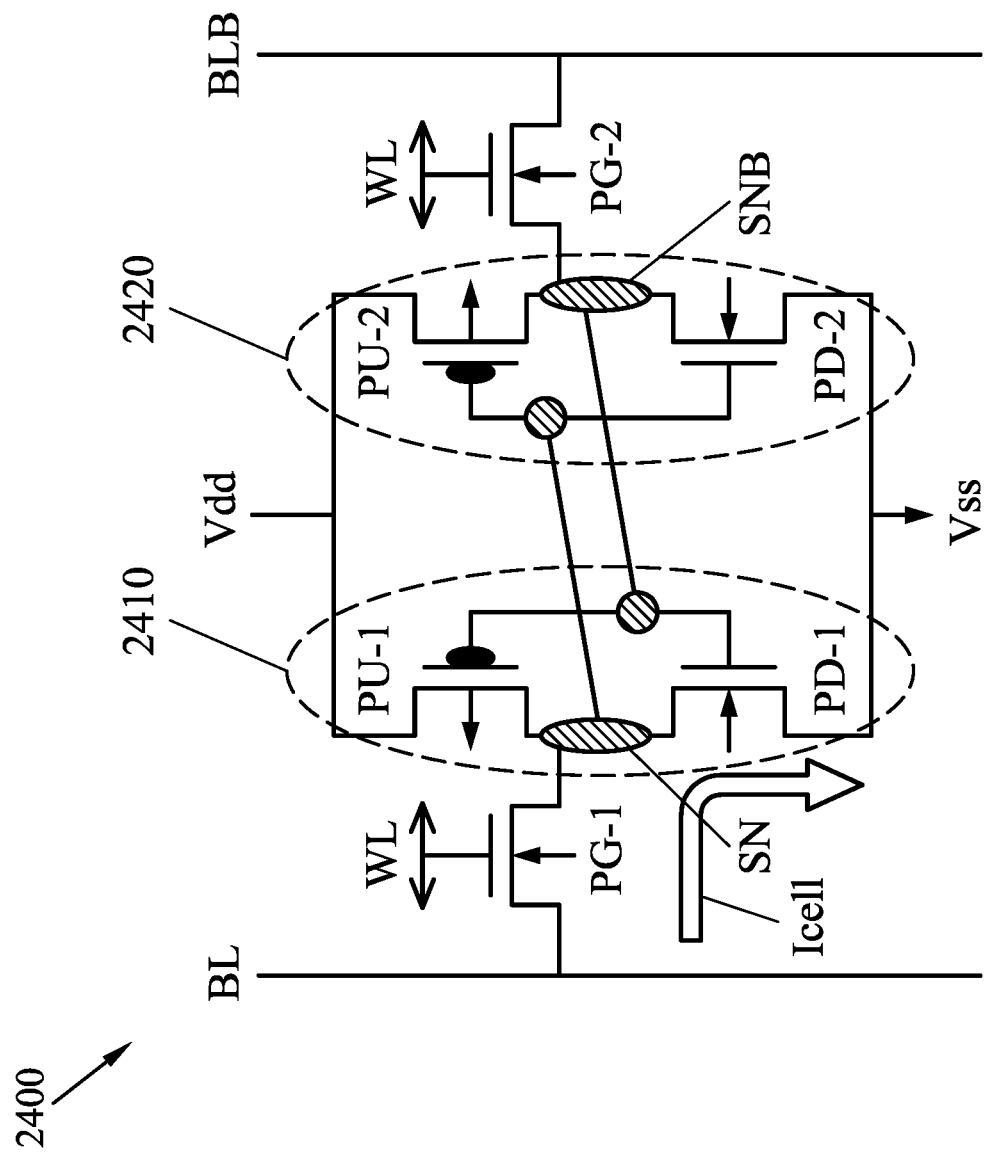
FIG. 14 provides an exemplary circuit diagram of an SRAM cell, which can be implemented in a memory cell of a SRAM array, according to various aspects of the present disclosure.

As discussed above, the method 200 may be used to fabricate GAA transistors used to implement SRAM devices. For instance, the P-type device region 305 includes P-type GAA transistors and may thus correspond to an SRAM P-type device region, and the N-type device region 307 includes N-type GAA transistors and may thus correspond to an SRAM N-type device region. To provide further detail regarding an SRAM device that may be fabricated in accordance with the disclosed methods, reference is now made to FIG. 14, which illustrates an exemplary circuit diagram of an SRAM cell 2400. In some embodiments, the SRAM cell 2400 may be implemented in a memory cell of an SRAM array. While FIG. 14 illustrates a single-port SRAM cell, it will be understood that the various disclosed embodiments may be equally implemented in a multi-port SRAM cell (e.g., such as a dual-port SRAM cell), without departing from the scope of the present disclosure. FIG. 14 has also been simplified for the sake of clarity to better understand the inventive concepts of the present disclosure. Additional features can be added in the SRAM cell 2400, and some of the features described below can be replaced, modified, or eliminated in other embodiments of SRAM cell 2400.

In some embodiments, the SRAM cell 2400 includes six transistors: a pass-gate transistor PG-1, a pass-gate transistor PG-2, a pull-up transistor PU-1, a pull-up transistor PU-2, a pull-down transistor PD-1, and a pull-down transistor PD-2. Thus, in some examples, the SRAM cell 2400 may be referred to as a 6T SRAM cell. In operation, pass-gate transistor PG-1 and pass-gate transistor PG-2 provide access to a storage portion of the SRAM cell 2400, which includes a cross-coupled pair of inverters, an inverter 2410 and an inverter 2420. Inverter 2410 includes the pull-up transistor PU-1 and the pull-down transistor PD-1, and inverter 2420 includes the pull-up transistor PU-2 and the pull-down transistor PD-2. In some implementations, pull-up transistors PU-1, PU-2 are configured as P-type GAA transistors (or P-type FinFETs), and pull-down transistors PD-1, PD-2 are configured as N-type GAA transistors (or N-type FinFETs). In some implementations, pass-gate transistors PG-1, PG-2 are also configured as N-type GAA transistors (or N-type FinFETs). Thus, in various embodiments, the pull-up transistors PU-1, PU-2 may be fabricated within the P-type device region 305 and may include P-type GAA transistors fabricated in accordance with the method 200. Similarly, in some examples, the pull-down transistors PD-1, PD-2 and the pass-gate transistors PG-1, PG-2 may be fabricated within the N-type device region 307 and may include N-type GAA transistors fabricated in accordance with the method 200.

A gate of pull-up transistor PU-1 interposes a source (electrically coupled with a power supply voltage (VDD)) and a first common drain (CD1), and a gate of pull-down transistor PD-1 interposes a source (electrically coupled with a power supply voltage (VSS)) and the first common drain. A gate of pull-up transistor PU-2 interposes a source (electrically coupled with power supply voltage (VDD)) and a second common drain (CD2), and a gate of pull-down transistor PD-2 interposes a source (electrically coupled with power supply voltage (VSS)) and the second common drain. In some implementations, the first common drain (CD1) is a storage node (SN) that stores data in true form, and the second common drain (CD2) is a storage node (SNB) that stores data in complementary form. The gate of pull-up transistor PU-1 and the gate of pull-down transistor PD-1 are coupled with the second common drain, and the gate of pull-up transistor PU-2 and the gate of pull-down transistor PD-2 are coupled with the first common drain. A gate of pass-gate transistor PG-1 interposes a source (electrically coupled with a bit line BL) and a drain, which is electrically coupled with the first common drain. A gate of pass-gate transistor PG-2 interposes a source (electrically coupled with a complementary bit line BLB) and a drain, which is electrically coupled with the second common drain. The gates of pass-gate transistors PG-1, PG-2 are electrically coupled with a word line WL. In some implementations, pass-gate transistors PG-1, PG-2 provide access to storage nodes SN, SNB during read operations and/or write operations. For example, pass-gate transistors PG-1, PG-2 couple storage nodes SN, SN-B respectively to bit lines BL, BLB in response to voltage applied to the gates of pass-gate transistors PG-1, PG-2 by WLs.

By employing the method 200 to fabricate SRAM devices, such as the SRAM cell 2400, such SRAM devices will have improved short-channel control, lower sub-threshold leakage, improved SRAM cell yield, and improved operation margin. For example, consider an SRAM cell current (Icell) that flows through the N-type pass gate transistor PG-1 and the N-type pull-down transistor PD-1. In accordance with various embodiments, the saturation drain current (Idsat) of each of the N-type pass gate transistor PG-1 and the N-type pull-down transistor PD-1 is increased, and the threshold voltage variation (Vt sigma) of each of the N-type pass gate transistor PG-1 and the N-type pull-down transistor PD-1 is decreased. As a result, and in some embodiments, the cell current (Icell) of the SRAM cell 2400 is increased and the and the Vccmin of the SRAM cell 2400 is decreased. Thus, performance (e.g., including cell read/write) of the SRAM cell 2400 is improved. Other embodiments and advantages of SRAM cells (e.g., such as the SRAM cell 2400) formed using multi-gate devices fabricated in accordance with the method 200 will be evident to those skilled in the art upon reading the present disclosure (e.g., such as improved short-channel control, lower sub-threshold leakage, improved cell yield, and improved operation margin).

With respect to the description provided herein, disclosed are methods and structures for providing multi-gate devices (e.g., such as a GAA transistors) having improved source/drain features. In some embodiments, prior to forming a source/drain epitaxial layer, an adhesion layer may be formed within a source/drain region. The adhesion layer may bond to both Si channel layer surfaces and to neighboring SiN inner spacer layer surfaces to provide a uniform base layer prior to subsequent source/drain epitaxial layer growth. The subsequently formed source/drain epitaxial layer, which in some examples is grown using silane, will grow over the adhesion layer along both Si channel layer surfaces and SiN inner spacer layer surfaces, resulting in a continuous source/drain epitaxial layer and effectively overcoming the epitaxial merge issue discussed above. In some embodiments, the adhesion layer includes a di-borane or di-phosphorous based material. In an embodiment, for P-type epitaxial source/drain layers, the adhesion layer may include $B_2H_x$ or $SiB_2H_x$. In another embodiment, for N-type epitaxial source/drain layers, the adhesion layer may include $P_2H_x$ or $SiP_2H_x$. In accordance with the embodiments disclosed herein, the disclosed adhesion layer provides for GAA transistors having improved source/drain features, where such GAA transistors may be used to fabricate SRAM devices having improved short-channel control, lower sub-threshold leakage, improved SRAM cell yield, and improved operation margin. Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a method that includes providing a fin extending from a substrate, where the fin includes a plurality of semiconductor channel layers. In some embodiments, the method further includes forming a gate structure over the fin. Thereafter, in some examples, the method includes removing a portion of the plurality of semiconductor channel layers within a source/drain region adjacent to the gate structure to form a trench in the source/drain region. In some cases, the method further includes after forming the trench, depositing an adhesion layer within the source/drain region along a sidewall surface of the trench. In various embodiments, and after depositing the adhesion layer, the method further includes epitaxially growing a continuous first source/drain layer over the adhesion layer along the sidewall surface of the trench.

In another of the embodiments, discussed is a method that includes providing a first fin in a first device region and a second fin in a second device region adjacent to the first device region. In some embodiments, the method further includes forming a first dummy gate over the first fin and a second dummy gate over the second fin. In some examples, the method further includes depositing a spacer layer over the first dummy gate, the second dummy gate, a first source/drain region adjacent to the first dummy gate, and a second source/drain region adjacent to the second dummy gate. In some embodiments, the method further includes removing the spacer layer from the first source/drain region and etching the first fin in the first source/drain region to form a first trench. In some examples, the method further includes after forming the first trench, depositing a di-borane based material within the first source/drain region along a first sidewall of the first trench. In some cases, the method further includes after depositing the di-borane based material, forming a first source/drain feature within the first source/drain region and over the di-borane based material deposited along the first sidewall of the first trench.

In yet another of the embodiments, discussed is a semiconductor device including a first gate structure formed over a first fin in a first region of a substrate and a first source/drain feature adjacent to the first gate structure. In some embodiments, the semiconductor device further includes a second gate structure formed over a second fin in a second region of the substrate and a second source/drain feature adjacent to the second gate structure. In some embodiments, the first fin includes a first plurality of semiconductor channel layers interposed by a first plurality of inner spacers, the first plurality of semiconductor channel layers and the first plurality of inner spacers collectively defining a first sidewall surface. In some examples, the second fin includes a second plurality of semiconductor channel layers interposed by a second plurality of inner spacers, the second plurality of semiconductor channel layers and the second plurality of inner spacers collectively defining a second sidewall surface. In various embodiments, a first continuous adhesion layer interposes, and is in contact with, each of the first source/drain feature and the first sidewall surface. Additionally, in some embodiments, a second continuous adhesion layer interposes, and is in contact with, each of the second source/drain feature and the second sidewall surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    providing a fin extending from a substrate, wherein the fin includes a plurality of semiconductor channel layers;
    forming a gate structure over the fin;
    removing a portion of the plurality of semiconductor channel layers within a source/drain region adjacent to the gate structure to form a trench in the source/drain region;
    after forming the trench and before epitaxially growing a source/drain layer, depositing an adhesion layer within the source/drain region along a sidewall surface of the trench; and
    after depositing the adhesion layer, epitaxially growing a continuous first source/drain layer over the adhesion layer along the sidewall surface of the trench.

2. The method of claim 1, further comprising:
    prior to depositing the adhesion layer, forming inner spacers along the sidewall surface of the trench, the inner spacers interposing adjacent semiconductor channel layers of the plurality of semiconductor channel layers, wherein the sidewall surface of the trench includes exposed surfaces of the plurality of semiconductor channel layers and exposed surfaces of the inner spacers.

3. The method of claim 2, wherein the depositing the adhesion layer includes depositing the adhesion layer over the exposed surfaces of the plurality of semiconductor channel layers and over the exposed surfaces of the inner spacers.

4. The method of claim 1, wherein the fin is provided in a P-type device type region, and wherein the depositing the adhesion layer includes depositing a di-borane based material within the source/drain region along the sidewall surface of the trench.

5. The method of claim 4, wherein the di-borane based material includes $B_2H_x$ or $SiB_2H_x$.

6. The method of claim 1, wherein the fin is provided in an N-type device type region, and wherein the depositing the adhesion layer includes depositing a di-phosphorous based material within the source/drain region along the sidewall surface of the trench.

7. The method of claim 6, wherein the di-phosphorous based material includes $P_2H_x$ or $SiP_2H_x$.

8. The method of claim 1, further comprising:
    after epitaxially growing the continuous first source/drain layer over the adhesion layer, epitaxially growing a second source/drain layer over the continuous first source/drain layer.

9. The method of claim 8, wherein the fin is provided in a P-type device type region, and wherein the first source/drain layer and the second source/drain layer include SiGe, SiB, or SiGeBx.

10. The method of claim 8, wherein the fin is provided in an N-type device type region, and wherein the first source/drain layer and the second source/drain layer include SiP, SiAs, or SiPAsx.

11. A method, comprising:
    providing a first fin in a first device region and a second fin in a second device region adjacent to the first device region;
    forming a first dummy gate over the first fin and a second dummy gate over the second fin;
    depositing a spacer layer over the first dummy gate, the second dummy gate, a first source/drain region adjacent to the first dummy gate, and a second source/drain region adjacent to the second dummy gate;
    removing the spacer layer from the first source/drain region and etching the first fin in the first source/drain region to form a first trench;
    after forming the first trench, depositing a di-borane based material within the first source/drain region along a first sidewall of the first trench, wherein the di-borane based material includes $SiB_2H_x$; and
    after depositing the di-borane based material, forming a first source/drain feature within the first source/drain region and over the di-borane based material deposited along the first sidewall of the first trench.

12. The method of claim 11, further comprising:
after forming the first source/drain feature, removing the spacer layer from the second source/drain region and etching the second fin in the second source/drain region to form a second trench;
after forming the second trench, depositing a di-phosphorous based material within the second source/drain region along a second sidewall of the second trench; and
after depositing the di-phosphorous based material, forming a second source/drain feature within the second source/drain region and over the di-phosphorous based material deposited along the second sidewall of the second trench.

13. The method of claim 11, wherein the first device region includes a P-type device region, and wherein the second device region includes an N-type device region.

14. The method of claim 12, wherein the di-phosphorous based material includes $P_2H_x$, or $SiP_2H_x$.

15. The method of claim 11, wherein the forming the first source/drain feature within the first source/drain region includes epitaxially growing a continuous first source/drain layer over the di-borane based material and epitaxially growing a second source/drain layer over the continuous first source/drain layer.

16. The method of claim 12, wherein the forming the second source/drain feature within the second source/drain region includes epitaxially growing a continuous first source/drain layer over the di-phosphorous based material and epitaxially growing a second source/drain layer over the continuous first source/drain layer.

17. A method, comprising:
forming a gate structure over a fin having plural channel layers;
forming a trench in a source/drain region adjacent to the gate structure, wherein a sidewall surface of the trench exposes surfaces of the plural channel layers and inner spacers that interpose adjacent ones of the plural channel layers;
conformally depositing an adhesion layer within the trench along exposed surfaces of the plural channel layers and the inner spacers; and
forming a continuous epitaxial source/drain layer over the adhesion layer, wherein the continuous epitaxial source/drain layer has an irregular profile.

18. The method of claim 17, wherein the adhesion layer includes a di-borane based material or a di-phosphorous based material.

19. The method of claim 18, wherein the di-borane based material includes $B_2H_x$ or $SiB_2H_x$, and wherein the di-phosphorous based material includes $P_2H_x$ or $SiP_2H_x$.

20. The method of claim 1, wherein the continuous first source/drain layer has an irregular profile.

* * * * *